United States Patent
Choi et al.

(10) Patent No.: US 10,923,434 B2
(45) Date of Patent: Feb. 16, 2021

(54) SEMICONDUCTOR PACKAGES HAVING EMI SHIELDING LAYERS

(71) Applicant: SK hynix Inc., Icheon-si (KR)

(72) Inventors: Bok Kyu Choi, Yongin-si (KR); Juil Eom, Guri-si (KR); Sang Joon Lim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/183,538

(22) Filed: Nov. 7, 2018

(65) Prior Publication Data

US 2019/0333865 A1 Oct. 31, 2019

(30) Foreign Application Priority Data

Apr. 25, 2018 (KR) .................. 10-2018-0048036

(51) Int. Cl.
*H01L 23/498* (2006.01)
*H01L 23/552* (2006.01)

(52) U.S. Cl.
CPC ...... *H01L 23/552* (2013.01); *H01L 23/49816* (2013.01); *H01L 23/49822* (2013.01); *H01L 23/49838* (2013.01)

(58) Field of Classification Search
CPC ......... H01L 23/49816; H01L 23/49822; H01L 23/552; H01L 23/49838
See application file for complete search history.

(56) References Cited

U.S. PATENT DOCUMENTS

| | | | | |
|---|---|---|---|---|
| 2008/0308912 | A1* | 12/2008 | Cha | H01L 23/552 257/659 |
| 2012/0193770 | A1* | 8/2012 | Yamada | H01L 23/552 257/659 |
| 2015/0014834 | A1 | 1/2015 | Teng et al. | |
| 2015/0179588 | A1* | 6/2015 | Choi | H01L 23/552 257/659 |
| 2015/0235966 | A1* | 8/2015 | Ohhashi | H01L 23/552 257/659 |
| 2016/0013155 | A1* | 1/2016 | Chung | H01L 23/552 257/659 |
| 2016/0073496 | A1* | 3/2016 | Vincent | H01L 23/552 361/772 |
| 2018/0197822 | A1* | 7/2018 | Sawamoto | H01L 23/552 |

FOREIGN PATENT DOCUMENTS

KR 10-2013-0113794 A 10/2013

* cited by examiner

*Primary Examiner* — Cuong Q Nguyen
(74) *Attorney, Agent, or Firm* — William Park & Associates Ltd.

(57) ABSTRACT

A semiconductor package may include a chip disposed on a substrate, a conductive structure disposed on the substrate to include a conductive structure frame including a side surface facing at least one side surface of the chip and to include conductive structure fingers extending from the conductive structure frame toward an edge of the substrate, and an electromagnetic interference (EMI) shielding layer covering the chip and the conductive structure and contacting a side surface of an end of one or more of the conductive structure fingers.

15 Claims, 12 Drawing Sheets

SEMICONDUCTOR PACKAGES HAVING EMI SHIELDING LAYERS

CROSS-REFERENCE TO RELATED APPLICATIONS

The present application claims priority under 35 U.S.C 119(a) to Korean Application No. 10-2018-0048036, filed on Apr. 25, 2018, which is herein incorporated by references in its entirety.

BACKGROUND

1. Technical Field

Various embodiments of the present disclosure generally relate to semiconductor packages and, more particularly, to semiconductor packages having electromagnetic interference (EMI) shielding layers.

2. Related Art

In general, semiconductor devices may be integrated with various electronic devices. In such a case, electromagnetic waves directly radiated or conducted from some of the electronic devices may degrade the receiving function of the other electronic devices or may cause malfunction of the other electronic devices. In particular, if highly integrated and compact semiconductor devices are employed in portable electronic systems such as mobile phones, it may be necessary to effectively shield the semiconductor devices in order to protect the semiconductor devices from an electromagnetic interference (EMI) phenomenon produced by electronic devices disposed in the portable electronic systems.

SUMMARY

According to an embodiment, a semiconductor package may include a chip disposed on a substrate, a conductive structure disposed on the substrate to include a conductive structure frame including a side surface facing at least one side surface of the chip and to include conductive structure fingers extending from the conductive structure frame toward an edge of the substrate, and an electromagnetic interference (EMI) shielding layer covering the chip and the conductive structure and contacting a side surface of an end of one or more of the conductive structure fingers.

According to an embodiment, a semiconductor package may include a substrate, a chip, a conductive structure, a molding member, and an electromagnetic interference (EMI) shielding layer. The substrate may include a substrate body having an interconnection layer connected to a ground terminal, an upper solder resist layer disposed on a top surface of the substrate body, and a lower solder resist layer disposed on a bottom surface of the substrate body. The chip may be disposed on the upper solder resist layer. The conductive structure may be disposed on the upper solder resist layer. The conductive structure may include a first conductive structure frame that is spaced apart from a side surface of the chip and extends in a first direction, a second conductive structure frame that is spaced apart from another side surface of the chip and extends in the first direction, a plurality of first conductive structure fingers that extend from an outer side surface of the first conductive structure frame opposite to the chip, and a plurality of second conductive structure fingers that extend from an outer side surface of the second conductive structure frame opposite to the chip. The molding member may be disposed to cover the chip and the conductive structure. The molding member may be disposed to expose side surfaces of both ends of the first conductive structure frame, side surfaces of both ends of the second conductive structure frame, side surfaces of ends of the first conductive structure fingers, and side surfaces of ends of the second conductive structure fingers. The electromagnetic interference (EMI) shielding layer may cover a top surface and side surfaces of the molding member. The EMI shielding layer may be in contact with the exposed side surfaces of the first and second conductive structure frames and the exposed side surfaces of the first and second conductive structure fingers.

According to an embodiment, a semiconductor package may include a substrate, a chip, a conductive structure, a molding member, and an electromagnetic interference (EMI) shielding layer. The substrate may include a substrate body having an interconnection layer connected to a ground terminal, an upper solder resist layer disposed on a top surface of the substrate body, and a lower solder resist layer disposed on a bottom surface of the substrate body. The chip may be disposed on the upper solder resist layer. The conductive structure may be disposed on the upper solder resist layer. The conductive structure may include a conductive structure frame and a plurality of conductive structure fingers. The conductive structure frame may have a closed loop shape to surround all side surfaces of the chip and to be spaced apart from the chip, and the plurality of conductive structure fingers may extend from an outer side surface of the conductive structure frame toward edges of the substrate. The molding member may be disposed to cover the chip and the conductive structure and to expose side surfaces of ends of the conductive structure fingers. The electromagnetic interference (EMI) shielding layer may cover a top surface and side surfaces of the molding member and contact the exposed side surfaces of the ends of the conductive structure fingers.

According to an embodiment, a semiconductor package may include a substrate, a chip, a conductive structure, a molding member, and an electromagnetic interference (EMI) shielding layer. The substrate may include a substrate body having first and second interconnection layers connected to a ground terminal, an upper solder resist layer disposed on a top surface of the substrate body, and a lower solder resist layer disposed on a bottom surface of the substrate body. The chip may be disposed on the upper solder resist layer. The conductive structure may be disposed on the upper solder resist layer. The conductive structure may include a first conductive structure frame that is spaced apart from a side surface of the chip and extends in a first direction, a second conductive structure frame that is spaced apart from another side surface of the chip and extends in the first direction, a plurality of first conductive structure fingers that extend from an outer side surface of the first conductive structure frame opposite to the chip, and a plurality of second conductive structure fingers that extend from an outer side surface of the second conductive structure frame opposite to the chip. The molding member may be disposed to cover the chip and the conductive structure. The molding member may be disposed to expose side surfaces of both ends of the first conductive structure frame, side surfaces of both ends of the second conductive structure frame, side surfaces of ends of the first conductive structure fingers, and side surfaces of ends of the second conductive structure fingers. The electromagnetic interference (EMI) shielding layer may cover a top surface and side surfaces of the molding member. The EMI shielding layer may be in contact with the exposed side surfaces of the first and second conductive structure frames and the exposed side surfaces of the first and second conductive structure fingers.

BRIEF DESCRIPTION OF THE DRAWINGS

Various embodiments of the present disclosure will become more apparent in view of the attached drawings and accompanying detailed description, in which.

DETAILED DESCRIPTION

In the following description of various embodiments of the present disclosure, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Various embodiments may be directed to semiconductor packages having electromagnetic interference (EMI) shielding layers.

In semiconductor packages, a general method of shielding the semiconductor packages from an electromagnetic interference (EMI) phenomenon may include forming an EMI shielding layer on a mold layer and a side surface of each of the semiconductor packages after forming the mold layer. In such a case, the EMI shielding layer may be formed to contact a side surface of an interconnection layer disposed in a package substrate. The interconnection layer contacting the EMI shielding layer may be grounded through an outer connection means attached to a bottom surface of the package substrate. Generally, the package substrate may have a reduced thickness. Thus, a contact area between the EMI shielding layer and the grounded interconnection layer may also be reduced. In such a case, a contact resistance value between the EMI shielding layer and the grounded interconnection layer may become higher and non-uniform to cause the degradation of an EMI shielding effect. Accordingly, various embodiments of the present disclosure provide semiconductor packages including a grounded conductive structure disposed on a top surface of the package substrate to have a plurality of exposed side surfaces and an EMI shielding layer disposed to be in contact with the exposed side surfaces of the grounded conductive structure. According to the semiconductor packages having the aforementioned configuration, a contact resistance value between the grounded conductive structure and the EMI shielding layer may become low and stable to improve the EMI shielding effect regardless of a thickness of the package substrate.

Figure 1:
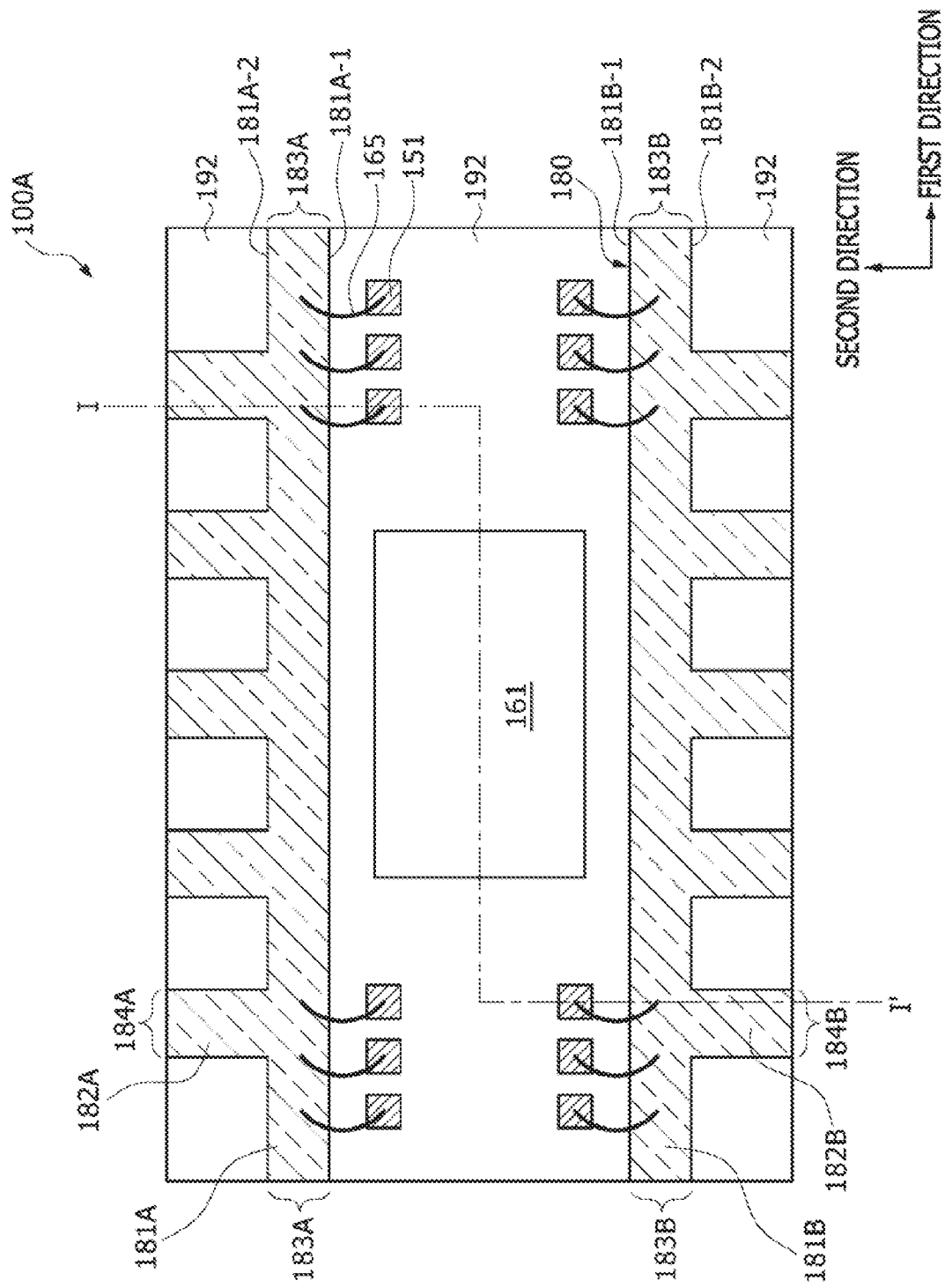
FIG. 1 is a layout diagram illustrating a planar structure of a semiconductor package according to an embodiment of the present disclosure.
Figure 2:
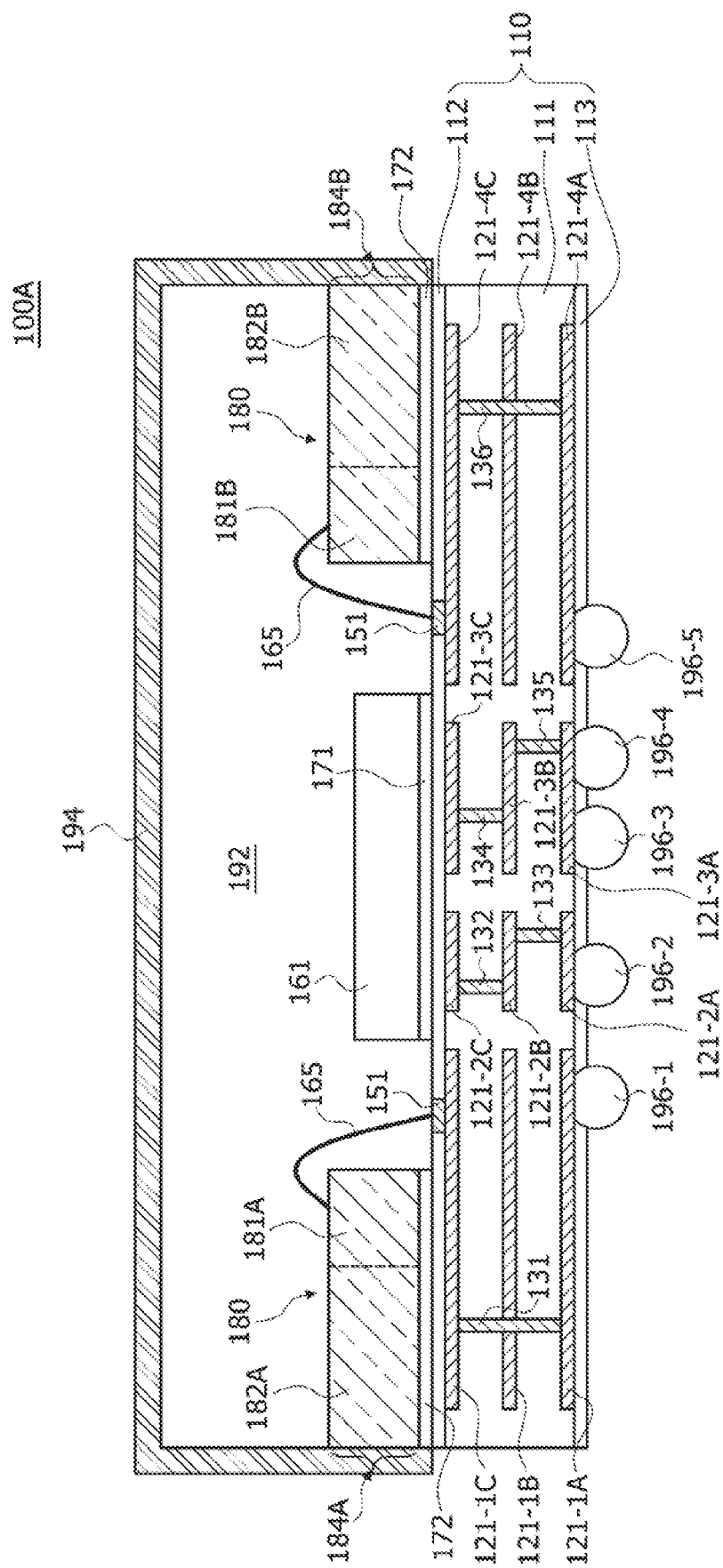
FIG. 2 is a cross-sectional view taken along a line I-I' of FIG. 1.

FIG. 1 is a layout diagram illustrating a planar structure of a semiconductor package 100A according to an embodiment of the present disclosure, and FIG. 2 is a cross-sectional view taken along a line I-I' of FIG. 1. A molding member 192 and an EMI shielding layer 194 illustrated in FIG. 2 are omitted in FIG. 1. Referring to FIGS. 1 and 2, the semiconductor package 100A may be configured to include a substrate 110, a chip 161, a conductive structure 180, a molding member 192, and an EMI shielding layer 194. The substrate 110 may include a substrate body 111, an upper solder resist layer 112 disposed on a top surface of the substrate body 111, and a lower solder resist layer 113 disposed on a bottom surface of the substrate body 111. A triple-layered interconnection structure may be disposed in the substrate body 111. Although FIG. 2 illustrates an example in which the interconnection structure is comprised of three layers located at different levels, the present disclosure is not limited thereto. For example, in some other embodiments, the layers included in the interconnection structure may be located at one level, two different levels, four different levels, or more different levels. In addition, the interconnection structure in the described embodiment is merely one example of suitable structures. That is, the interconnection structure disposed in the substrate body 111 may be modified into any one of various different forms according to a purpose of the semiconductor package 100A.

The interconnection structure in the substrate body 111 may be configured to include lower interconnection layers 121-1A, 121-2A, 121-3A, and 121-4A disposed in a lower portion of the substrate body 111; upper interconnection layers 121-1C, 121-2C, 121-3C, and 121-4C disposed in an upper portion of the substrate body 111; and intermediate interconnection layers 121-1B, 121-2B, 121-3B, and 121-4B disposed in a middle portion of the substrate body 111. The interconnection layers located at different levels may be electrically connected to each other using various techniques. For example, the interconnection layers located at different levels may be electrically connected to each other through via structures. In an embodiment, the lower interconnection layer 121-1A and the upper interconnection layer 121-1C may be electrically connected to each other by a first via 131. The upper interconnection layers 121-2C and 121-3C may be electrically connected to the intermediate interconnection layers 121-2B and 121-3B through second and fourth vias 132 and 134, respectively. The intermediate interconnection layers 121-2B and 121-3B may be electrically connected to the lower interconnection layers 121-2A and 121-3A through third and fifth vias 133 and 135, respectively. The lower interconnection layer 121-4A and the upper interconnection layer 121-4C may be electrically connected to each other through a sixth via 136. Although not illustrated in the drawings, the intermediate interconnection layer 121-1B may be electrically connected to the lower interconnection layer 121-1A and the upper interconnection layer 121-1C through other vias, and the intermediate interconnection layer 121-4B may also be electrically connected to the lower interconnection layer 121-4A and the upper interconnection layer 121-4C through other vias.

The upper solder resist layer 112 may be disposed on a top surface of the substrate body 111 and top surfaces of the upper interconnection layers 121-1C, 121-2C, 121-3C, and 121-4C. The upper solder resist layer 112 may have openings that expose portions of the upper interconnection layers 121-1C and 121-4C. Bonding pads 151 may be disposed on the exposed portions of the upper interconnection layers 121-1C and 121-4C, respectively. The number of the bonding pads 151 may be two or more. The bonding pads 151 may be disposed not to vertically overlap with the chip 161 and the conductive structure 180. The lower solder resist layer 113 may be disposed on a bottom surface of the substrate body 111 and bottom surfaces of the lower interconnection layers 121-1A, 121-2A, 121-3A, and 121-4A. The lower solder resist layer 113 may have openings that expose portions of the lower interconnection layers 121-1A, 121-2A, 121-3A, and 121-4A.

Solder balls 196-1, 196-2, 196-3, 196-4, and 196-5 may be disposed on the exposed portions of the lower interconnection layers 121-1A, 121-2A, 121-3A, and 121-4A. The solder balls 196-1, 196-2, 196-3, 196-4, and 196-5 may be attached to a motherboard of an external electronic device to act as signal transmitters between the semiconductor package 100A and the motherboard. In an embodiment, the solder ball 196-1 connected to the lower interconnection layer 121-1A and the solder ball 196-5 connected to the lower interconnection layer 121-4A among the solder balls 196-1, 196-2, 196-3, 196-4, and 196-5 may be connected to a ground terminal, and the remaining solder balls 196-2, 196-3, and 196-4 may correspond to connection means for transmitting signals and a power supply voltage. In such a case, the bonding pads 151 may be connected to the solder balls 196-1 and 196-5 having a ground voltage through the upper interconnection layers 121-1C and 121-4C, the first and sixth vias 131 and 136, and the lower interconnection layers 121-1A and 121-4A. In some instances, the bonding pads 151 may be connected to the solder balls 196-1 and 196-5 having a ground voltage through the upper interconnection layers 121-1C and 121-4C, the intermediate interconnection layers 121-1B and 121-4B, the first and sixth vias 131 and 136, and the lower interconnection layers 121-1A and 121-4A. In an embodiment, the lower interconnection layers 121-1A and 121-4A, the intermediate interconnection layers 121-1B and 121-4B, and the upper interconnection layers 121-1C and 121-4C may be disposed in the substrate body 111 such that side surfaces of the lower interconnection layers 121-1A and 121-4A, the intermediate interconnection layers 121-1B and 121-4B, and the upper interconnection layers 121-1C and 121-4C are not exposed at side surfaces of the substrate body 111.

The chip 161 may be attached to a first region (e.g., a chip attachment region) of the upper solder resist layer 112 using an adhesive agent 171. Although not illustrated in the drawings, the chip 161 may be electrically connected to the interconnection layers disposed in the substrate body 111 through wires. Alternatively, the chip 161 may be electrically connected to the interconnection layers disposed in the substrate body 111 using a flip chip bonding technique without using any wire. The conductive structure 180 may be attached to a second region of the upper solder resist layer 112 using an adhesive agent 172. The adhesive agent 172 may include an insulation material. The conductive structure 180 may be configured to include a first conductive structure frame 181A, a second conductive structure frame 181B, a plurality of first conductive structure fingers 182A and a plurality of second conductive structure fingers 182B.

The first conductive structure frame 181A and the second conductive structure frame 181B may be respectively disposed at both sides of the chip 161 and may extend in a first direction to have stripe shapes. In addition, each of the first conductive structure frame 181A and the second conductive structure frame 181B may be provided to have a uniform width in a second direction intersecting the first direction. The first conductive structure frame 181A may have a first side surface 181A-1 facing a central portion of the semiconductor package 100A and a second side surface 181A-2 facing an outside region of the semiconductor package 100A. That is, the first side surface 181A-1 of the first conductive structure frame 181A may be located to face the chip 161, and the second side surface 181A-2 of the first conductive structure frame 181A may be located at an opposite side facing away from the chip 161 (i.e., located at a side opposite to the chip 161). The second conductive structure frame 181B may have a first side surface 181B-1 facing a central portion of the semiconductor package 100A and a second side surface 181B-2 facing an outside region of the semiconductor package 100A. That is, the first side surface 181B-1 of the second conductive structure frame 181B may be located to face the chip 161, and the second side surface 181B-2 of the second conductive structure frame 181B may be located at an opposite side facing away from the chip 161 (i.e., located at a side opposite to the chip 161). Accordingly, the first side surface 181A-1 of the first conductive structure frame 181A and the first side surface 181B-1 of the second conductive structure frame 181B may be spaced apart from each other in the second direction and may face each other. Both ends of the first conductive structure frame 181A extending in the first direction and in an opposite direction to the first direction may have side surfaces 183A which are vertically aligned with both side surfaces of the substrate 110, respectively. Similarly, both ends of the second conductive structure frame 181B extending in the first direction and in an opposite direction to the first direction may also have side surfaces 183B which are vertically aligned with both side surfaces of the substrate 110, respectively.

The plurality of first conductive structure fingers 182A may extend from the second side surface 181A-2 of the first conductive structure frame 181A in the second direction. That is, the first conductive structure frame 181A and the plurality of first conductive structure fingers 182A may constitute a single unified body without any heterogeneous junction between the first conductive structure frame 181A and each of the plurality of first conductive structure fingers 182A. The plurality of first conductive structure fingers 182A may be disposed to be spaced apart from each other in the first direction. A side surface 184A of an end of each of the first conductive structure fingers 182A extending in the second direction may be vertically aligned with a side surface of the substrate 110. The plurality of second conductive structure fingers 1823 may extend from the second side surface 181B-2 of the second conductive structure frame 181B in an opposite direction to the second direction. That is, the second conductive structure frame 181B and the plurality of second conductive structure fingers 182B may constitute a single unified body without any heterogeneous junction between the second conductive structure frame 181B and each of the plurality of second conductive structure fingers 182B. The plurality of second conductive structure fingers 182B may be disposed to be spaced apart from each other in the first direction. A side surface 184B of an end of each of the second conductive structure fingers 182B extending in an opposite direction to the second direction may be vertically aligned with a side surface of the substrate 110. Each of the first conductive structure frame 181A and the second conductive structure frame 181B may be electrically connected to the bonding pads 151 through wires 165. The first side surface 181A-1 of the first conductive structure frame 181A may be disposed to be spaced apart from a first side surface of the chip 161. The first side surface 181B-1 of the second conductive structure frame 181B may be disposed to be spaced apart from a second side surface of the chip 161. In an embodiment, the first side surface and the second side surface of the chip 161 may be opposite to each other.

The molding member 192 formed by a molding process may be disposed on the substrate 110. The molding member 192 may include an epoxy molding compound (EMC) material. The molding member 192 may be disposed to cover all of a top surface and side surfaces of the chip 161. The molding member 192 may cover the first conductive structure frame 181A and the first conductive structure fingers 182A except the side surfaces 183A of the first conductive structure frame 181A and the side surfaces 184A of the first conductive structure fingers 182A. In addition, the molding member 192 may cover the second conductive structure frame 181B and the second conductive structure fingers 182B except the side surfaces 183B of the second conductive structure frame 181B and the side surfaces 184B of the second conductive structure fingers 182B. The molding member 192 and the side surface 184A of the first conductive structure finger 182A may be alternately disposed in the first direction at a side surface of the molding member 192 exposing the plurality of first conductive structure fingers 182A. Similarly, the molding member 192 and the side surface 184B of the second conductive structure finger 182B may be alternately disposed in the first direction at another side surface of the molding member 192 exposing the plurality of second conductive structure fingers 182B.

The EMI shielding layer 194 may be disposed on a top surface and side surfaces of the molding member 192. In an embodiment, the EMI shielding layer 194 may include a single-layered metal material or a multi-layered metal material. The EMI shielding layer 194 may cover all of the top surface and the side surfaces of the molding member 192 and may extend to directly contact the side surfaces 183A of the first conductive structure frame 181A, the side surfaces 184A of the first conductive structure fingers 182A, the side surfaces 183B of the second conductive structure frame 181B, and the side surfaces 184B of the second conductive structure fingers 182B. The first conductive structure finger 182A and the molding member 192 may be alternately arrayed in the first direction at a side surface of the molding member 192 and may be in contact with the EMI shielding layer 194. The second conductive structure finger 182B and the molding member 192 may be alternately arrayed in the first direction at another side surface of the molding member 192 and may be in contact with the EMI shielding layer 194. As such, since the first and second conductive structure fingers 182A and 182B having a relatively strong adhesive strength to a metal material are disposed to be exposed at both sides of the molding member 192, a relatively weak adhesive strength between the molding member 192 and the EMI shielding layer 194 may be compensated with the first and second conductive structure fingers 182A and 182B that directly contact the EMI shielding layer 194.

The EMI shielding layer 194 may be grounded through the first conductive structure fingers 182A; the first conductive structure frame 181A; the wires 165; the bonding pads 151; the interconnection layers 121-1A, 121-1B, and 121-1C disposed in the substrate body 111; the first via 131; and the solder ball 196-1. In addition, the EMI shielding layer 194 may also be grounded through the second conductive structure fingers 182B; the second conductive structure frame 181B; the wires 165; the bonding pads 151; the interconnection layers 121-4A, 121-4B, and 121-4C disposed in the substrate body 111; the sixth via 136; and the solder ball 196-5. In an embodiment, the EMI shielding layer 194 may be grounded through the first conductive structure fingers 182A, the first conductive structure frame 181A, the wires 165, the bonding pads 151, the interconnection layers 121-1A and 121-1C disposed in the substrate body 111, the first via 131, and the solder ball 196-1. In addition, the EMI shielding layer 194 may also be grounded through the second conductive structure fingers 182B, the second conductive structure frame 181B, the wires 165, the bonding pads 151, the interconnection layers 121-4A and 121-4C disposed in the substrate body 111, the sixth via 136, and the solder ball 196-5.

As described above, the EMI shielding layer 194 of the semiconductor package 100A according to an embodiment may be grounded even without directly contacting the interconnection layers disposed in the substrate body 111. Thus, it may be unnecessary to extend the interconnection layers to the side surfaces of the substrate 110 in order to expose the interconnection layers. In general semiconductor packages, interconnection layers disposed in a substrate body may be used as signal transmission paths between a chip mounted on the substrate body and an external device. Thus, the general semiconductor packages may require the interconnection layers having a high electric conductivity. For example, a copper material having a high electric conductivity of approximately $5.8 \times 10^7$ s/m may be widely used in formation of the interconnection layers. However, the copper material may be easily oxidized if the copper material is exposed to the air. If the interconnection layers formed of the copper material is oxidized, an electric conductivity of the interconnection layers may be lowered. Accordingly, if side surfaces of the interconnection layers employed in the general semiconductor packages are exposed at side surfaces of the substrate body to be in contact with an EMI shielding layer of the general semiconductor packages, the exposed side surfaces of the interconnection layers may be easily oxidized before the EMI shielding layer is formed. In such a case, a contact resistance value between the EMI shielding layer and each of the interconnection layers may increase due to the oxidized side surfaces of the interconnection layers. In contrast, the conductive structure 180 of the semiconductor package 100A according to an embodiment may be provided to reduce the contact resistance value between the conductive structure 180 and the EMI shielding layer 194 and to electrically connect the EMI shielding layer 194 to a ground terminal. Thus, it may be unnecessary to form the conductive structure 180 using a material having a relatively high electric conductivity. Therefore, the conductive structure 180 may be realized using an oxidation-resistant material even though the oxidation-resistant material has a low electric conductivity. For example, the conductive structure 180 may be realized using a stainless steel material because the stainless steel material is less susceptible to oxidation as compared to other materials when exposed to the air, even though the stainless steel material has an electric conductivity which is lower than an electric conductivity of the copper material. Accordingly, if the conductive structure 180 is realized using an oxidation-resistant material, a contact resistance value between the conductive structure 180 and the EMI shielding layer 194 may be uniform and relatively low since the oxidation-resistant material is less susceptible to oxidation even though the oxidation-resistant material is exposed to the air before the EMI shielding layer 194 is formed.

Figure 3:
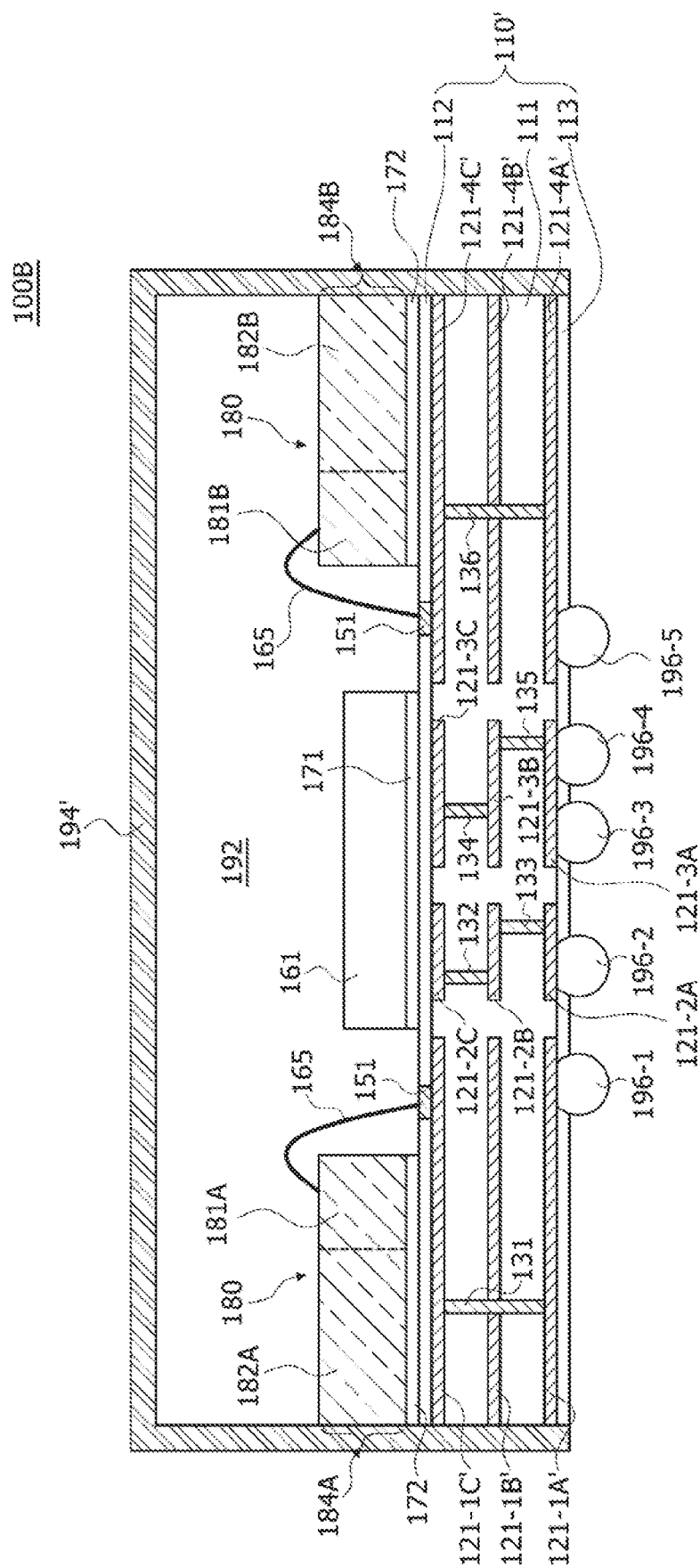
FIG. 3 is a cross-sectional view illustrating another example of the semiconductor package illustrated in FIG. 2.

FIG. 3 is a cross-sectional view illustrating a semiconductor package 100B corresponding to another example of the semiconductor package 100A illustrated in FIG. 2. The semiconductor package 100B may have the same planar structure as illustrated in FIG. 1, and FIG. 3 may also be a cross-sectional view taken along the line I-I' of FIG. 1. In FIG. 3, the same reference numerals as used in FIG. 2 denote the same elements. Thus, detailed descriptions of the same elements as set forth with reference to FIG. 2 will be omitted hereinafter to avoid a repeated description. Referring to FIG. 3, a substrate 110' of the semiconductor package 100B may be configured to include lower interconnection layers 121-1A', 121-2A, 121-3A, and 121-4A' disposed in a lower portion of the substrate body 111; upper interconnection layers 121-1C', 121-2C, 121-3C, and 121-4C' disposed in an upper portion of the substrate body 111; and intermediate interconnection layers 121-1B', 121-2B, 121-3B, and 121-4B' disposed in a middle portion of the substrate body 111. The lower interconnection layer 121-1A' and the upper interconnection layer 121-1C' may be electrically connected to each other by the first via 131. The lower interconnection layer 121-4A' and the upper interconnection layer 121-4C' may be electrically connected to each other through the sixth via 136.

The solder ball 196-1 connected to the lower interconnection layer 121-1A' and the solder ball 196-5 connected to the lower interconnection layer 121-4A' among the solder balls 196-1, 196-2, 196-3, 196-4, and 196-5 may be connected to a ground terminal. Thus, the bonding pads 151 disposed on the substrate body 111 may be connected to the solder balls 196-1 and 196-5 having a ground voltage through the upper interconnection layers 121-1C' and 121-4C', the first and sixth vias 131 and 136, and the lower interconnection layers 121-1A' and 121-4A'. In some instances, the bonding pads 151 disposed on the substrate body 111 may be connected to the solder balls 196-1 and 196-5 having a ground voltage through the upper interconnection layers 121-1C and 121-4C', the intermediate interconnection layers 121-1B' and 121-4B', the first and sixth vias 131 and 136, and the lower interconnection layers 121-1A' and 121-4A'. In the example illustrated in FIG. 3, outer side surfaces of the lower interconnection layers 121-1A' and 121-4A', outer side surfaces of the intermediate interconnection layers 121-1B' and 121-4B', and outer side surfaces of the upper interconnection layers 121-1C' and 121-4C' may be exposed at side surfaces of the substrate body 111. As such, all of the lower interconnection layers 121-1A' and 121-4A', the intermediate interconnection layers 121-1B' and 121-4B', and the upper interconnection layers 121-1C' and 121-4C', which are exposed at the side surfaces of the substrate body 111, may be defined as grounded interconnection layers electrically connected to the ground terminal. The semiconductor package 100B may also include an EMI shielding layer 194'. The EMI shielding layer 194' may be disposed to cover the top surface and the side surfaces of the molding member 192 as well as the outer side surfaces of the conductive structure 180. Moreover, the EMI shielding layer 194' may extend to be in contact with side surfaces of the substrate body 111, side surfaces of the upper and lower solder resist layers 112 and 113, the exposed outer side surfaces of the lower interconnection layers 121-1A' and 121-4A', the exposed outer side surfaces of the intermediate interconnection layers 121-1B' and 121-4B', and the exposed outer side surfaces of the upper interconnection layers 121-1C' and 121-4C'. Accordingly, since the EMI shielding layer 194' is grounded through the interconnection layers in the substrate body 111 in addition to the conductive structure 180, an EMI shielding effect of the semiconductor package 100B may be improved.

Figure 4:
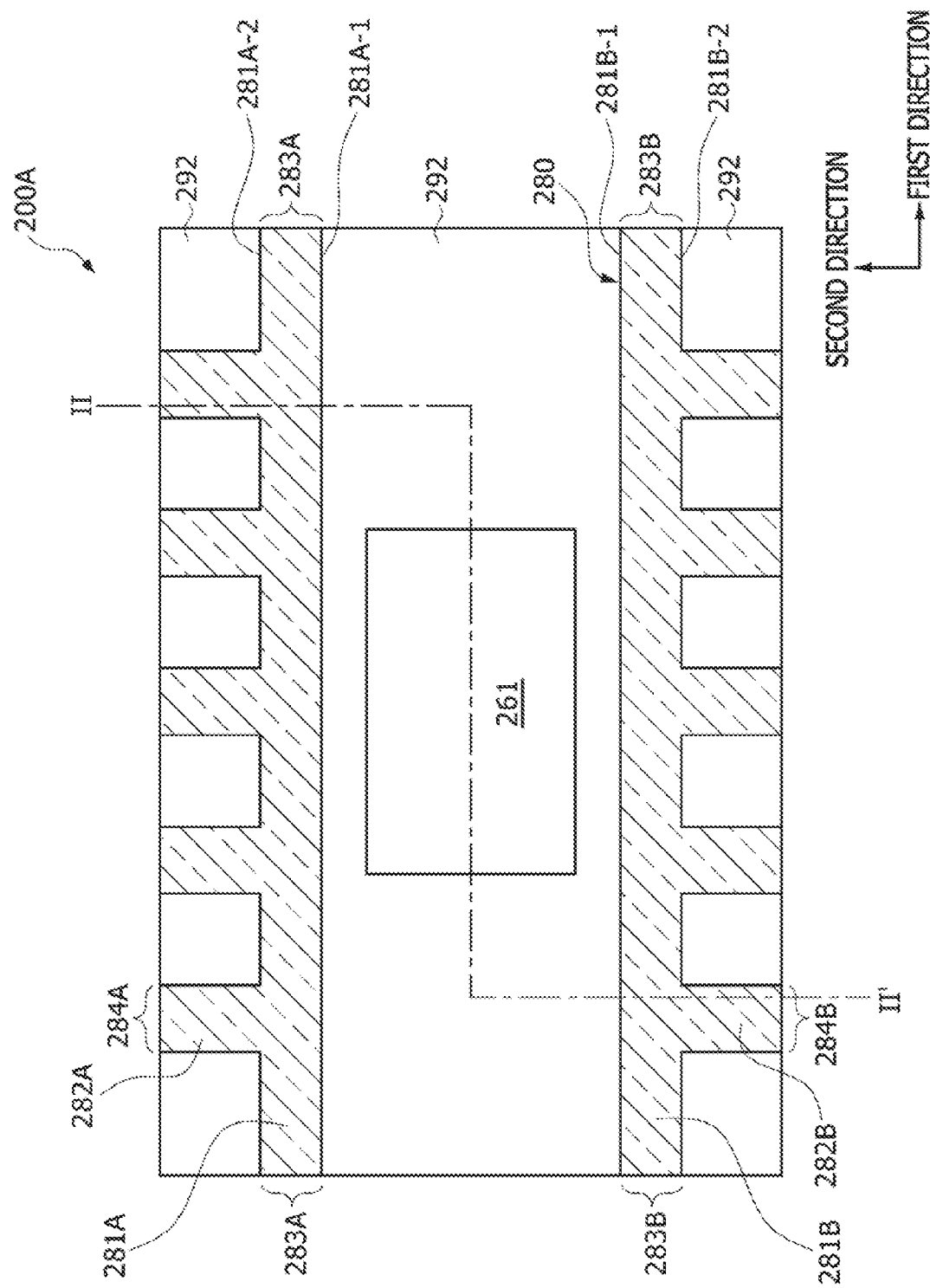
FIG. 4 is a layout diagram illustrating a planar structure of a semiconductor package according to other embodiments of the present disclosure.
Figure 5:
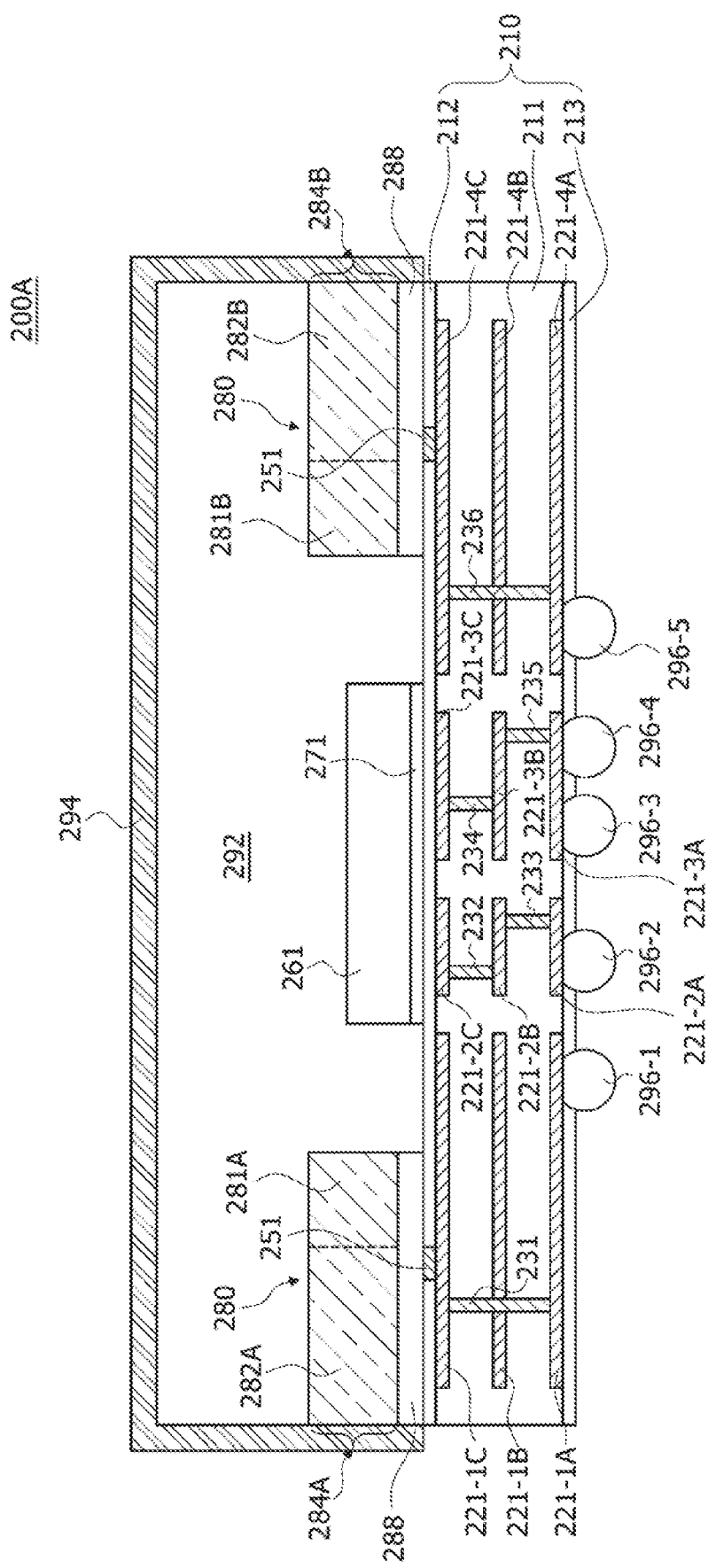
FIG. 5 is a cross-sectional view taken along a line II-II' of FIG. 4.

FIG. 4 is a layout diagram illustrating a planar structure of a semiconductor package 200A according to other embodiments of the present disclosure, and FIG. 5 is a cross-sectional view taken along a line II-II' of FIG. 4. A molding member 292 and an EMI shielding layer 294 illustrated in FIG. 5 are omitted in the layout diagram of FIG. 4. Referring to FIGS. 4 and 5, the semiconductor package 200A may be configured to include a substrate 210, a chip 261, a conductive structure 280, a molding member 292, and an EMI shielding layer 294. The substrate 210 may include a substrate body 211, an upper solder resist layer 212 disposed on a top surface of the substrate body 211, and a lower solder resist layer 213 disposed on a bottom surface of the substrate body 211. A triple-layered interconnection structure may be disposed in the substrate body 211. Although FIG. 5 illustrates an example in which the interconnection structure is comprised of three layers located at different levels, the present disclosure is not limited thereto. For example, in some other embodiments, the layers included in the interconnection structure may be located at one level, two different levels, four different levels, or more different levels. In addition, the interconnection structure in the described embodiment is merely one example of suitable structures. That is, the interconnection structure disposed in the substrate body 211 may be modified into any one of various different forms according to various embodiments.

The interconnection structure in the substrate body 211 may be configured to include lower interconnection layers 221-1A, 221-2A, 221-3A, and 221-4A disposed in a lower portion of the substrate body 211; upper interconnection layers 221-1C, 221-2C, 221-3C, and 221-4C disposed in an upper portion of the substrate body 211; and intermediate interconnection layers 221-1B, 221-2B, 221-3B, and 221-4B disposed in a middle portion of the substrate body 211. The interconnection layers located at different levels may be electrically connected to each other using various techniques. For example, the interconnection layers located at different levels may be electrically connected to each other through via structures. In the an embodiment, the lower interconnection layer 221-1A and the upper interconnection layer 221-1C may be electrically connected to each other by a first via 231. The upper interconnection layers 221-2C and 221-3C may be electrically connected to the intermediate interconnection layers 221-2B and 221-3B through second and fourth vias 232 and 234, respectively. The intermediate interconnection layers 221-2B and 221-3B may be electrically connected to the lower interconnection layers 221-2A and 221-3A through third and fifth vias 233 and 235, respectively. The lower interconnection layer 221-4A and the upper interconnection layer 221-4C may be electrically connected to each other through a sixth via 236. Although not illustrated in the drawings, the intermediate interconnection layer 221-1B may be electrically connected to the lower interconnection layer 221-1A and the upper interconnection layer 221-1C through other vias, and the intermediate interconnection layer 221-4B may also be electrically connected to the lower interconnection layer 221-4A and the upper interconnection layer 221-4C through other vias.

The upper solder resist layer 212 may be disposed on a top surface of the substrate body 211 and top surfaces of the upper interconnection layers 221-1C, 221-2C, 221-3C, and 221-4C. The upper solder resist layer 212 may have openings that expose portions of the upper interconnection layers 221-1C and 221-4C. Contact pads 251 may be disposed on the exposed portions of the upper interconnection layers 221-1C and 221-4C, respectively. The number of the contact pads 251 may be two or more. The contact pads 251 may be disposed not to vertically overlap with the chip 261 but to vertically overlap with the conductive structure 280. The lower solder resist layer 213 may be disposed on a bottom surface of the substrate body 211 and bottom surfaces of the lower interconnection layers 221-1A, 221-2A, 221-3A, and 221-4A. The lower solder resist layer 213 may have openings that expose portions of the lower interconnection layers 221-1A, 221-2A, 221-3A, and 221-4A.

Solder balls 296-1, 296-2, 296-3, 296-4, and 296-5 may be disposed on the exposed portions of the lower interconnection layers 221-1A, 221-2A, 221-3A, and 221-4A. The solder balls 296-1, 296-2, 296-3, 296-4, and 296-5 may be attached to a motherboard of an external electronic device to act as signal transmitters between the semiconductor package 200A and the motherboard. In an embodiment, the solder ball 296-1 connected to the lower interconnection layer 221-1A and the solder ball 296-5 connected to the lower interconnection layer 221-4A among the solder balls 296-1, 296-2, 296-3, 296-4, and 296-5 may be connected to a ground terminal, and the remaining solder balls 296-2, 296-3, and 296-4 may correspond to connection means for transmitting signals and a power supply voltage. Thus, the contact pads 251 on the substrate body 211 may be connected to the solder balls 296-1 and 296-5 having a ground voltage through the upper interconnection layers 221-1C and 221-4C, the first and sixth vias 231 and 236, and the lower interconnection layers 221-1A and 221-4A. In some instances, the contact pads 251 on the substrate body 211 may be connected to the solder balls 296-1 and 296-5 having a ground voltage through the upper interconnection layers 221-1C and 221-4C, the intermediate interconnection layers 221-1B and 221-4B, the first and sixth vias 231 and 236, and the lower interconnection layers 221-1A and 221-4A. In an embodiment, the lower interconnection layers 221-1A and 221-4A, the intermediate interconnection layers 221-1B and 221-4B, and the upper interconnection layers 221-1C and 221-4C may be disposed in the substrate body 211 such that side surfaces of the lower interconnection layers 221-1A and 221-4A, the intermediate interconnection layers 221-1B and 221-4B, and the upper interconnection layers 221-1C and 221-4C are not exposed at side surfaces of the substrate body 211.

The chip 261 may be attached to a first region (e.g., a chip attachment region) of the upper solder resist layer 212 using an adhesive agent 271. Although not illustrated in the drawings, the chip 261 may be electrically connected to the interconnection layers disposed in the substrate body 211 through wires. Alternatively, the chip 261 may be electrically connected to the interconnection layers disposed in the substrate body 211 using a flip chip bonding technique without using any wire. The conductive structure 280 may be attached to a second region of the upper solder resist layer 212 using a conductive adhesive layer 288. In an embodiment, the conductive adhesive layer 288 may be provided to electrically connect the conductive structure 280 to the interconnection layers in the substrate body 211. That is, the conductive structure 280 may be electrically connected to the interconnection layers in the substrate body 211 through the conductive adhesive layer 288 even without using the wires 165 described with reference to FIGS. 1 to 3. The conductive structure 280 may be configured to include a first conductive structure frame 281A, a second conductive structure frame 281B, a plurality of first conductive structure fingers 282A, and a plurality of second conductive structure fingers 282B.

The first conductive structure frame 281A and the second conductive structure frame 281B may be respectively disposed at both sides of the chip 261 and may extend in a first direction to have stripe shapes. In addition, each of the first conductive structure frame 281A and the second conductive structure frame 281B may be provided to have a uniform width in a second direction intersecting the first direction. The first conductive structure frame 281A may have a first side surface 281A-1 facing a central portion of the semiconductor package 200A and a second side surface 281A-2 facing an outside region of the semiconductor package 200A. That is, the first side surface 281A-1 of the first conductive structure frame 281A may be located to face the chip 261, and the second side surface 281A-2 of the first conductive structure frame 281A may be located at an opposite side facing away from the chip 261. The second conductive structure frame 281B may have a first side surface 281B-1 facing a central portion of the semiconductor package 200A and a second side surface 281B-2 facing an outside region of the semiconductor package 200A. That is, the first side surface 281B-1 of the second conductive structure frame 281B may be located to face the chip 261, and the second side surface 281B-2 of the second conductive structure frame 281B may be located at an opposite side facing away from the chip 261. Accordingly, the first side surface 281A-1 of the first conductive structure frame 281A and the first side surface 281B-1 of the second conductive structure frame 281B may be spaced apart from each other in the second direction and may face each other. Both ends of the first conductive structure frame 281A extending in the first direction and in an opposite direction to the first direction may have side surfaces 283A which are vertically aligned with both side surfaces of the substrate 210, respectively. Similarly, both ends of the second conductive structure frame 281B extending in the first direction and in an opposite direction to the first direction may also have side surfaces 283B which are vertically aligned with both side surfaces of the substrate 210, respectively.

The plurality of first conductive structure fingers 282A may extend from the second side surface 281A-2 of the first conductive structure frame 281A in the second direction. That is, the first conductive structure frame 281A and the plurality of first conductive structure fingers 282A may constitute a single unified body without any heterogeneous junction between the first conductive structure frame 281A and each of the plurality of first conductive structure fingers 282A. The plurality of first conductive structure fingers 282A may be disposed to be spaced apart from each other in the first direction. A side surface 284A of an end of each of the first conductive structure fingers 282A extending in the second direction may be vertically aligned with a side surface of the substrate 210. The plurality of second conductive structure fingers 282B may extend from the second side surface 281B-2 of the second conductive structure frame 281B in an opposite direction to the second direction. That is, the second conductive structure frame 281B and the plurality of second conductive structure fingers 282B may constitute a single unified body without any heterogeneous junction between the second conductive structure frame 281B and each of the plurality of second conductive structure fingers 282B. The plurality of second conductive structure fingers 282B may be disposed to be spaced apart from each other in the first direction. A side surface 284B of an end of each of the second conductive structure fingers 282B extending in an opposite direction to the second direction may be vertically aligned with a side surface of the substrate 210. The first side surface 281A-1 of the first conductive structure frame 281A may be disposed to be spaced apart from a first side surface of the chip 261. The first side surface 281B-1 of the second conductive structure frame 281B may be disposed to be spaced apart from a second side surface of the chip 261. In an embodiment, the first side surface and the second side surface of the chip 261 may be opposite to each other.

Some portions of a bottom surface of the conductive adhesive layer 288 may be in direct contact with the contact pads 251, respectively. In an embodiment, the conductive adhesive layer 288 may include a solder paste material or bumps. Alternatively, the conductive adhesive layer 288 may include a conductive paste material or a conductive film. Accordingly, the conductive structure 280 may be electrically connected to the upper interconnection layers 221-1C and 221-4C through the conductive adhesive layer 288 and the contact pads 251. In an embodiment, the conductive adhesive layer 288 may be disposed to vertically overlap with the conductive structure 280 including the first conductive structure frame 281A, the plurality of first conductive structure fingers 282A, the second conductive structure frame 281B, and the plurality of second conductive structure fingers 282B.

The molding member 292 formed by a molding process may be disposed on the substrate 210. The molding member 292 may include an epoxy molding compound (EMC) material. The molding member 292 may be disposed to cover all of a top surface and side surfaces of the chip 261. The molding member 292 may cover the first conductive structure frame 281A and the first conductive structure fingers 282A except the side surfaces 283A of the first conductive structure frame 281A and the side surfaces 284A of the first conductive structure fingers 282A. In addition, the molding member 292 may cover the second conductive structure frame 281B and the second conductive structure fingers 282B except the side surfaces 2833 of the second conductive structure frame 281B and the side surfaces 284B of the second conductive structure fingers 282B. The molding member 292 and the side surface 284A of the first conductive structure finger 282A may be alternately disposed in the first direction at a side surface of the molding member 292 exposing the plurality of first conductive structure fingers 282A. Similarly, the molding member 292 and the side surface 284B of the second conductive structure finger 282B may be alternately disposed in the first direction at another side surface of the molding member 292 exposing the plurality of second conductive structure fingers 282B.

The EMI shielding layer 294 may be disposed on a top surface and side surfaces of the molding member 292. In an embodiment, the EMI shielding layer 294 may include a single-layered metal material or a multi-layered metal material. The EMI shielding layer 294 may cover all of the top surface and the side surfaces of the molding member 292 and may extend to directly contact the side surfaces 283A of the first conductive structure frame 281A, the side surfaces 284A of the first conductive structure fingers 282A, the side surfaces 283B of the second conductive structure frame 281B, and the side surfaces 284B of the second conductive structure fingers 282B. The first conductive structure finger 282A and the molding member 292 may be alternately arrayed in the first direction at a side surface of the molding member 292 and may be in contact with the EMI shielding layer 294. The second conductive structure finger 282B and the molding member 292 may be alternately arrayed in the first direction at another side surface of the molding member 292 and may be in contact with the EMI shielding layer 294. As such, since the first and second conductive structure fingers 282A and 282B having a relatively strong adhesive strength to a metal material are disposed to be exposed at both sides of the molding member 292, a relatively weak adhesive strength between the molding member 292 and the EMI shielding layer 294 may be compensated with the first and second conductive structure fingers 282A and 282B that directly contact the EMI shielding layer 294.

According to the semiconductor package 200A, the EMI shielding layer 294 may be grounded through the first conductive structure fingers 282A; the first conductive structure frame 281A; the conductive adhesive layer 288; the contact pads 251; the interconnection layers 221-1A, 221-1B, and 221-1C disposed in the substrate body 211; the first via 231; and the solder ball 296-1. In addition, the EMI shielding layer 294 may also be grounded through the second conductive structure fingers 282B; the second conductive structure frame 28113; the conductive adhesive layer 288; the contact pads 251; the interconnection layers 221-4A, 221-4B, and 221-4C disposed in the substrate body 211; the sixth via 236; and the solder ball 296-5. In an embodiment, the EMI shielding layer 294 may be grounded through the first conductive structure fingers 282A, the first conductive structure frame 281A, the conductive adhesive layer 288, the contact pads 251, the interconnection layers 221-1A and 221-1C disposed in the substrate body 211, the first via 231, and the solder ball 296-1. In addition, the EMI shielding layer 294 may also be grounded through the second conductive structure fingers 282B, the second conductive structure frame 281B, the conductive adhesive layer 288, the contact pads 251, the interconnection layers 221-4A and 221-4C disposed in the substrate body 211, the sixth via 236, and the solder ball 296-5.

Figure 6:
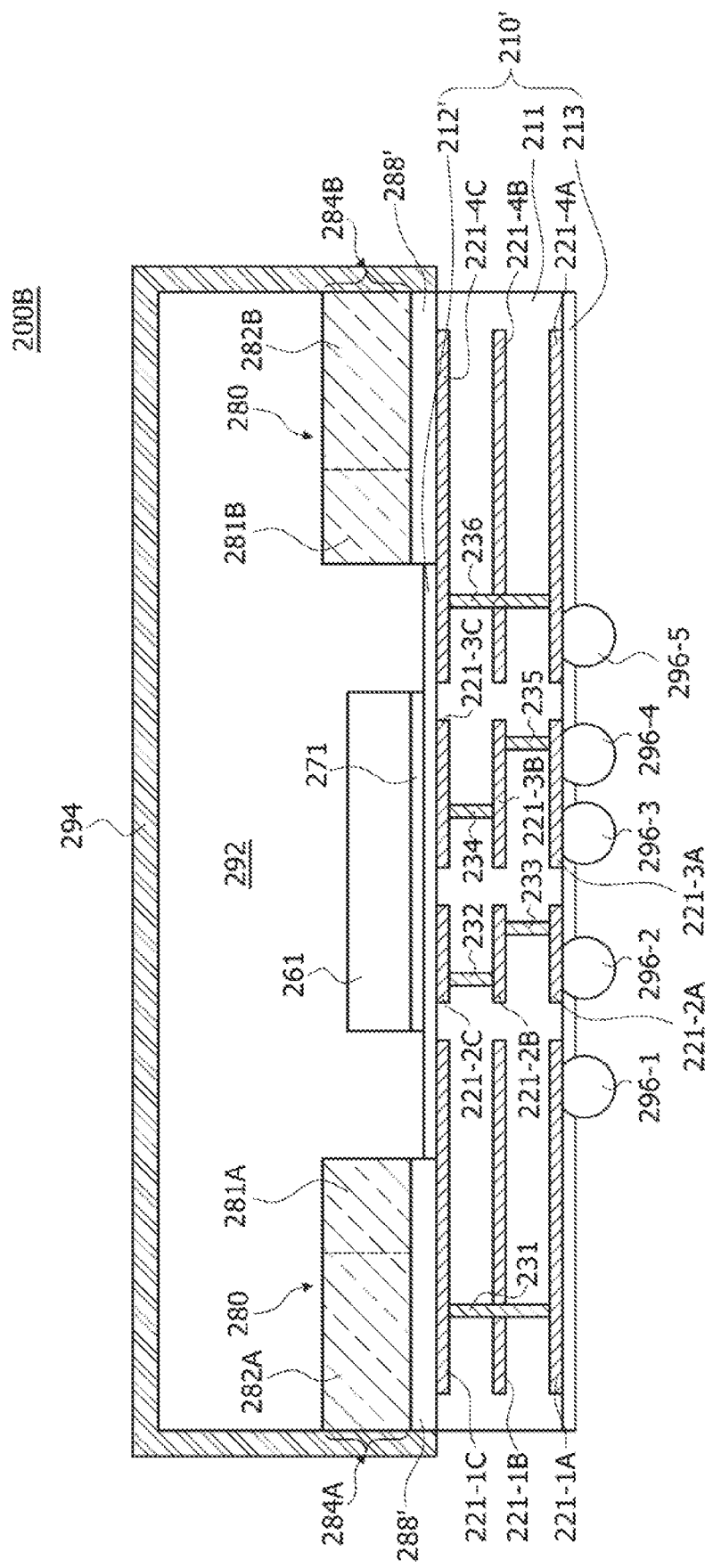
FIG. 6 is a cross-sectional view illustrating another example of the semiconductor package illustrated in FIG. 5.

FIG. 6 is a cross-sectional view illustrating a semiconductor package 200B corresponding to another example of the semiconductor package 200A illustrated in FIG. 5. The semiconductor package 200B may have the same planar structure as illustrated in FIG. 4, and FIG. 6 may also be a cross-sectional view taken along the line II-II' of FIG. 4. In FIG. 6, the same reference numerals as used in FIG. 5 denote the same elements. Thus, detailed descriptions of the same elements as set forth with reference to FIG. 5 will be omitted hereinafter to avoid a repeated description. Referring to FIG. 6, the semiconductor package 200B may include a substrate 210' which is comprised of the substrate body 211, an upper solder resist layer 212' disposed on a top surface of the substrate body 211, and the lower solder resist layer 213 disposed on a bottom surface of the substrate body 211. The upper solder resist layer 212' may be disposed to have openings that expose portions of the upper interconnection layers 221-1C and 221-4C. Accordingly, each of the upper interconnection layers 221-1C and 221-4C disposed in the substrate body 211 may be partially exposed by the opening of the upper solder resist layer 212'. A conductive adhesive layer 288' may be disposed to directly contact the exposed portions of the upper interconnection layers 221-1C and 221-4C. A contact area between the conductive adhesive layer 288' and each of the upper interconnection layers 221-1C and 221-4C may be equal to a planar area of each of the openings of the upper solder resist layer 212'. Thus, a contact resistance value between the conductive adhesive layer 288' and each of the upper interconnection layers 221-1C and 221-4C may be reduced by increasing a planar area of each of the openings of the upper solder resist layer 212'.

According to the semiconductor package 200B, the EMI shielding layer 294 may be grounded through the first conductive structure fingers 282A; the first conductive structure frame 281A; the conductive adhesive layer 288'; the interconnection layers 221-1A, 221-1B, and 221-1C disposed in the substrate body 211; the first via 231; and the solder ball 296-1. In addition, the EMI shielding layer 294 may also be grounded through the second conductive structure fingers 282B; the second conductive structure frame 281B; the conductive adhesive layer 288'; the interconnection layers 221-4A, 221-4B, and 221-4C disposed in the substrate body 211; the sixth via 236; and the solder ball 296-5. In an embodiment, the EMI shielding layer 294 may be grounded through the first conductive structure fingers 282A, the first conductive structure frame 281A, the conductive adhesive layer 288', the interconnection layers 221-1A and 221-1C disposed in the substrate body 211, the first via 231, and the solder ball 296-1. In addition, the EMI shielding layer 294 may also be grounded through the second conductive structure fingers 282B, the second conductive structure frame 281B, the conductive adhesive layer 288', the interconnection layers 221-4A and 221-4C disposed in the substrate body 211, the sixth via 236, and the solder ball 296-5.

Figure 7:
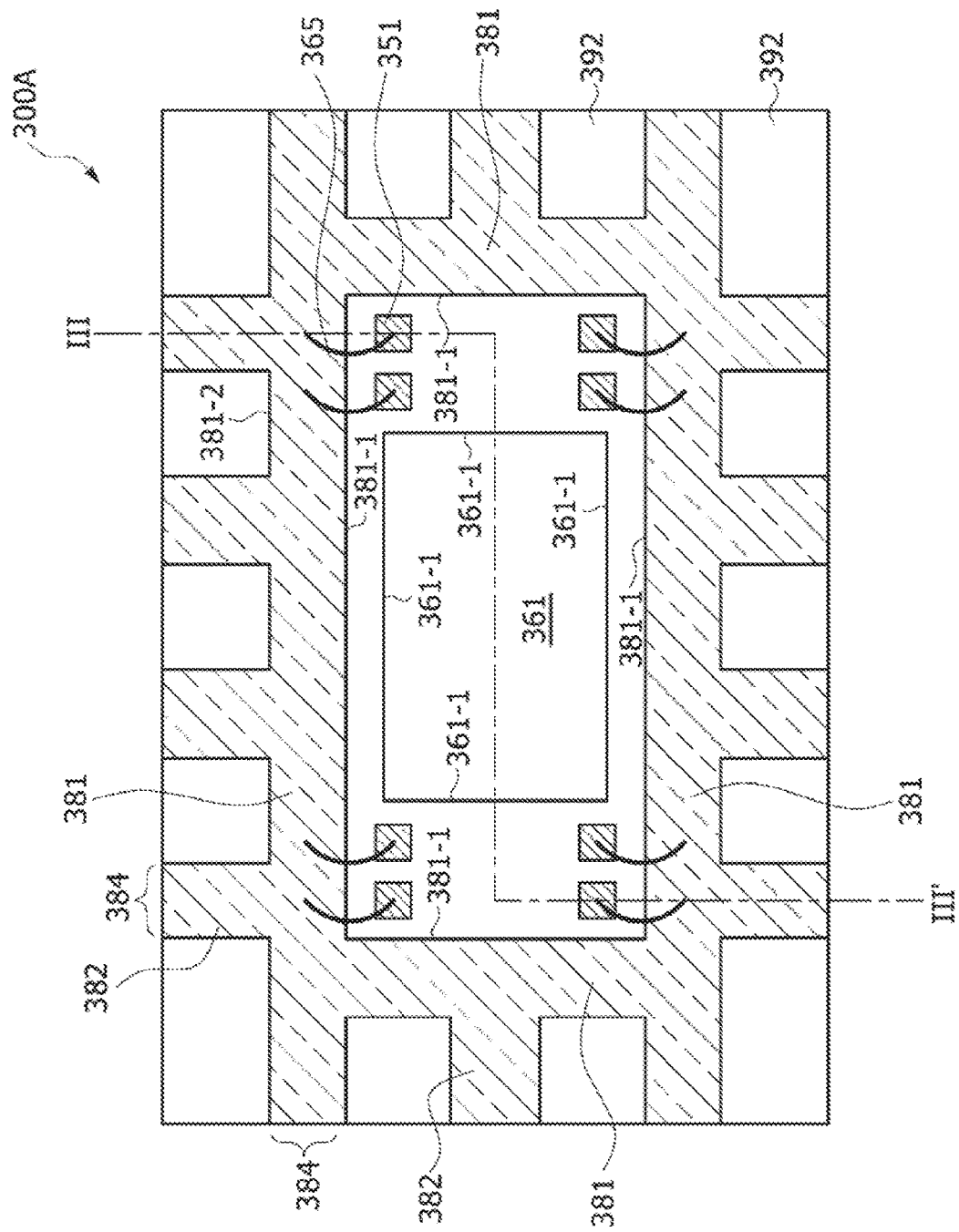
FIG. 7 is a layout diagram illustrating a planar structure of a semiconductor package according to other embodiments of the present disclosure.
Figure 8:
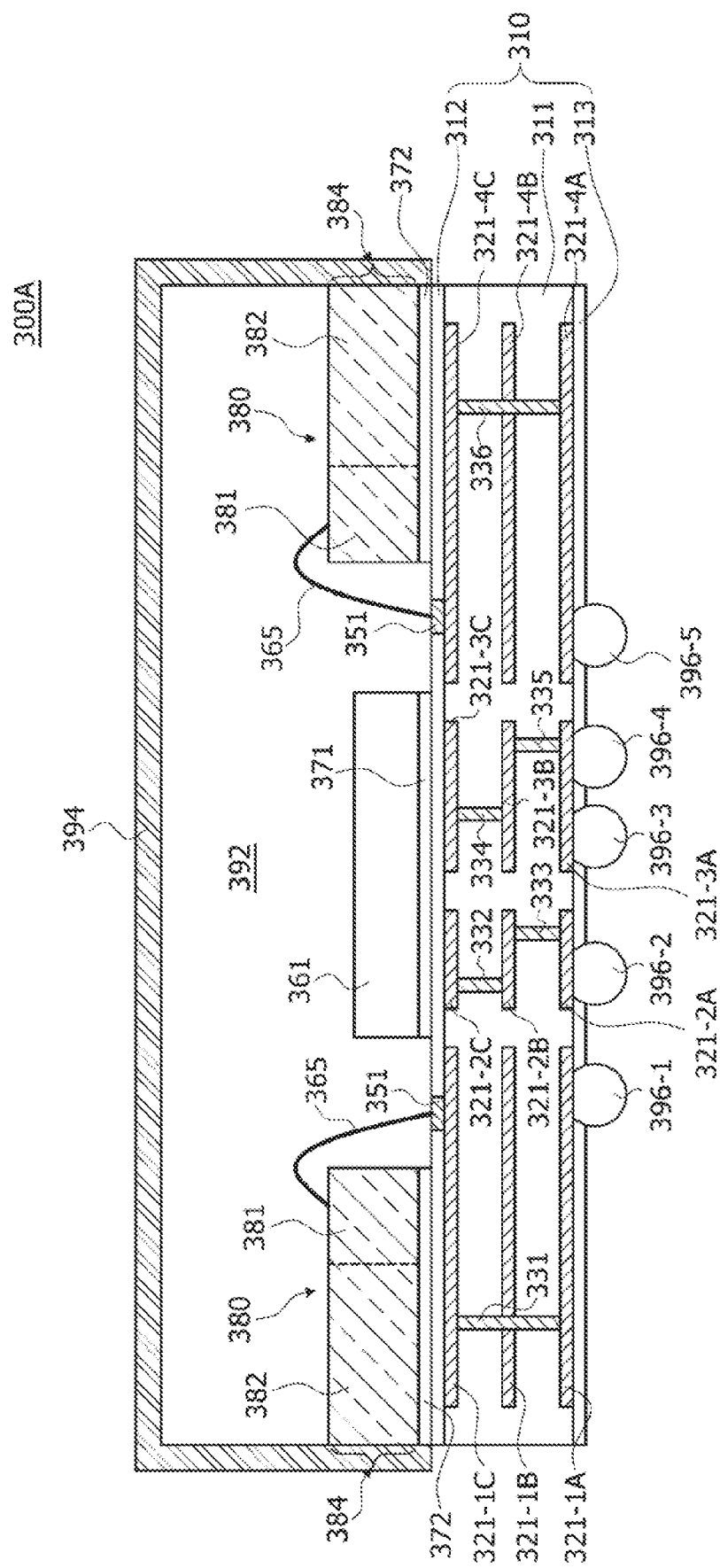
FIG. 8 is a cross-sectional view taken along a line of FIG. 7.

FIG. 7 is a layout diagram illustrating a planar structure of a semiconductor package 300A according to other embodiments of the present disclosure, and FIG. 8 is a cross-sectional view taken along a line III-III' of FIG. 7. A molding member 392 and an EMI shielding layer 394 illustrated in FIG. 8 are omitted in FIG. 7. Referring to FIGS. 7 and 8, the semiconductor package 300A may be configured to include a substrate 310, a chip 361, a conductive structure 380, a molding member 392, and an EMI shielding layer 394. The substrate 310 may include a substrate body 311, an upper solder resist layer 312 disposed on a top surface of the substrate body 311, and a lower solder resist layer 313 disposed on a bottom surface of the substrate body 311. A triple-layered interconnection structure may be disposed in the substrate body 311. Although FIG. 8 illustrates an example in which the interconnection structure is comprised of three layers located at different levels, the present disclosure is not limited thereto. For example, in some other embodiments, the layers included in the interconnection structure may be located at one level, two different levels, four different levels, or more different levels. In addition, the interconnection structure in the described embodiment is merely one example of suitable structures. That is, the interconnection structure disposed in the substrate body 311 may be modified into any one of various different forms according to a purpose of the semiconductor package 300A.

The interconnection structure in the substrate body 311 may be configured to include lower interconnection layers 321-1A, 321-2A, 321-3A, and 321-4A disposed in a lower portion of the substrate body 311; upper interconnection layers 321-1C, 321-2C, 321-3C, and 321-4C disposed in an upper portion of the substrate body 311; and intermediate interconnection layers 321-1B, 321-2B, 321-3B, and 321-4B disposed in a middle portion of the substrate body 311. The interconnection layers located at different levels may be electrically connected to each other using various techniques. For example, the interconnection layers located at different levels may be electrically connected to each other through via structures. In an embodiment, the lower interconnection layer 321-1A and the upper interconnection layer 321-1C may be electrically connected to each other by a first via 331. The upper interconnection layers 321-2C and 321-3C may be electrically connected to the intermediate interconnection layers 321-2B and 321-3B through second and fourth vias 332 and 334, respectively. The intermediate interconnection layers 321-2B and 321-3B may be electrically connected to the lower interconnection layers 321-2A and 321-3A through third and fifth vias 333 and 335, respectively. The lower interconnection layer 321-4A and the upper interconnection layer 321-4C may be electrically connected to each other through a sixth via 336. Although not illustrated in the drawings, the intermediate interconnection layer 321-1B may be electrically connected to the lower interconnection layer 321-1A and the upper interconnection layer 321-1C through other vias, and the intermediate interconnection layer 321-4B may also be electrically connected to the lower interconnection layer 321-4A and the upper interconnection layer 321-4C through other vias.

The upper solder resist layer 312 may be disposed on a top surface of the substrate body 311 and top surfaces of the upper interconnection layers 321-1C, 321-2C, 321-3C, and 321-4C. The upper solder resist layer 312 may have openings that expose portions of the upper interconnection layers 321-1C and 321-4C. Bonding pads 351 may be disposed on the exposed portions of the upper interconnection layers 321-1C and 321-4C, respectively. The number of the bonding pads 351 may be two or more. The bonding is pads 351 may be disposed not to vertically overlap with the chip 361 and the conductive structure 380. The lower solder resist layer 313 may be disposed on a bottom surface of the substrate body 311 and bottom surfaces of the lower interconnection layers 321-1A, 321-2A, 321-3A, and 321-4A. The lower solder resist layer 313 may have openings that expose portions of the lower interconnection layers 321-1A, 321-2A, 321-3A, and 321-4A.

Solder balls 396-1, 396-2, 396-3, 396-4, and 396-5 may be disposed on the exposed portions of the lower interconnection layers 321-1A, 321-2A, 321-3A, and 321-4A. The solder balls 396-1, 396-2, 396-3, 396-4, and 396-5 may be attached to a motherboard of an external electronic device to act as signal transmitters between the semiconductor package 300A and the motherboard. In an embodiment, the solder ball 396-1 connected to the lower interconnection layer 321-1A and the solder ball 396-5 connected to the lower interconnection layer 321-4A among the solder balls 396-1, 396-2, 396-3, 396-4, and 396-5 may be connected to a ground terminal, and the remaining solder balls 396-2, 396-3, and 396-4 may correspond to connection means for transmitting signals and a power supply voltage. In such a case, the bonding pads 351 may be connected to the solder balls 396-1 and 396-5 having a ground voltage through the upper interconnection layers 321-1C and 321-4C, the first and sixth vias 331 and 336, and the lower interconnection layers 321-1A and 321-4A. In some instances, the bonding pads 351 may be connected to the solder balls 396-1 and 396-5 having a ground voltage through the upper interconnection layers 321-1C and 321-4C, the intermediate interconnection layers 321-1B and 321-4B, the first and sixth vias 331 and 336, and the lower interconnection layers 321-1A and 321-4A. In an embodiment, the lower interconnection layers 321-1A and 321-4A, the intermediate interconnection layers 321-1B and 321-4B, and the upper interconnection layers 321-1C and 321-4C may be disposed in the substrate body 311 such that side surfaces of the lower interconnection layers 321-1A and 321-4A, the intermediate interconnection layers 321-1B and 321-4B, and the upper interconnection layers 321-1C and 321-4C are not exposed at side surfaces of the substrate body 311.

The chip 361 may be attached to a first region (e.g., a chip attachment region) of the upper solder resist layer 312 using an adhesive agent 371. Although not shown in the drawings, the chip 361 may be electrically connected to the interconnection layers disposed in the substrate body 311 through wires. Alternatively, the chip 361 may be electrically connected to the interconnection layers disposed in the substrate body 311 using a flip chip bonding technique without using any wire. The conductive structure 380 may be attached to a second region of the upper solder resist layer 312 using an adhesive agent 372. The adhesive agent 372 may include an insulation material.

The conductive structure 380 may be configured to include a conductive structure frame 381 and a plurality of conductive structure fingers 382. The conductive structure frame 381 may have a uniform width and may have a closed loop shape in a plan view to surround all side surfaces 361-1 of the chip 361. The conductive structure frame 381 may be disposed to be spaced apart from the chip 361. That is, inner side surfaces 381-1 of the conductive structure frame 381 may be spaced apart from side surfaces 361-1 of the chip 361. A physical stiffness property of the semiconductor package 300A may be improved because of the presence of the conductive structure frame 381 having a closed loop shape. In addition, the conductive structure frame 381 may act as a supporter for stably maintaining the initial structure of the substrate 310 and the molding member 392 without any deformation while the semiconductor package 300A is fabricated. The conductive structure frame 381 may be electrically connected to the boding pads 351 through wires 365. The plurality of conductive structure fingers 382 may extend from an outer side surface 381-2 of the conductive structure frame 381 toward edges of the substrate 310. That is, the conductive structure frame 381 and the plurality of conductive structure fingers 382 may constitute a single unified body without any heterogeneous junction between the conductive structure frame 381 and each of the plurality of conductive structure fingers 382. The plurality of conductive structure fingers 382 may be disposed to be spaced apart from each other along the side surfaces of the semiconductor package 300A (e.g., along all the sides surfaces of the semiconductor package 300A). Side surfaces 384 of ends of the conductive structure fingers 382 extending toward the edges of the substrate 310 may be vertically aligned with side surfaces of the substrate 310.

The molding member 392 formed by a molding process may be disposed on the substrate 310. The molding member 392 may include an epoxy molding compound (EMC) material. The molding member 392 may be disposed to cover all of a top surface and side surfaces of the chip 361. The molding member 392 may cover the conductive structure frame 381 and the conductive structure fingers 382 except the side surfaces 384 of the conductive structure fingers 382. The molding member 392 and the side surface 384 of the conductive structure finger 382 may be alternately disposed along the side surfaces of the semiconductor package 300A. In an embodiment, the molding member 392 may cover the conductive structure frame 381 such that the conductive structure frame 381 is embedded in the molding member 392. The conductive structure frame 381 may be embedded such that the conductive structure frame 381 is not exposed at any surface of the molding member 392.

The EMI shielding layer 394 may be disposed on a top surface and side surfaces of the molding member 392. In an embodiment, the EMI shielding layer 394 may include a single-layered metal material or a multi-layered metal material. The EMI shielding layer 394 may cover all of the top surface and the side surfaces of the molding member 392 and may extend to directly contact the side surfaces 384 of the conductive structure fingers 382. The conductive structure finger 382 and the molding member 392 may be alternately arrayed along the side surfaces of the semiconductor package 300A and may be in contact with the EMI shielding layer 394. As such, since the conductive structure fingers 382 having a relatively strong adhesive strength to a metal material are disposed to be exposed at all of the side surfaces of the molding member 392, a relatively weak adhesive strength between the molding member 392 and the EMI shielding layer 394 may be compensated with the conductive structure finger 382 that directly contact the EMI shielding layer 394. According to the semiconductor package 300A described above, the EMI shielding layer 394 may be grounded through the conductive structure fingers 382; the conductive structure frame 381; the wires 365; the bonding pads 351; the interconnection layers 321-1A, 321-1B, 321-1C, 321-4A, 321-4B, and 321-4C disposed in the substrate body 311; the first and sixth vias 331 and 336; and the solder balls 396-1 and 396-5. In an embodiment, the EMI shielding layer 394 may be grounded through the conductive structure fingers 382; the conductive structure frame 381; the wires 365; the bonding pads 351; the interconnection layers 321-1A, 321-1C, 321-4A, and 321-4C disposed in the substrate body 311; the first and sixth vias 331 and 336; and the solder balls 396-1 and 396-5.

As described above, the EMI shielding layer 394 of the semiconductor package 300A may be grounded even without directly contacting the interconnection layers disposed in the substrate body 311. Thus, it may be unnecessary to extend the interconnection layers to the side surfaces of the substrate 310 in order to expose the interconnection layers. In general semiconductor packages, interconnection layers disposed in a substrate body may be used as signal transmission paths between a chip mounted on the substrate body and an external device. Thus, the general semiconductor packages may require the interconnection layers having a high electric conductivity. For example, a copper material having a high electric conductivity of approximately $5.8 \times 10^7$ s/m may be widely used in formation of the interconnection layers. However, the copper material may be easily oxidized if the copper material is exposed to the air. If the interconnection layers formed of the copper material is oxidized, an electric conductivity of the interconnection layers may be lowered. Accordingly, if side surfaces of the interconnection layers employed in the general semiconductor packages are exposed at side surfaces of the substrate body to be in contact with an EMI shielding layer of the general semiconductor packages, the exposed side surfaces of the interconnection layers may be easily oxidized before the EMI shielding layer is formed. In such a case, a contact resistance value between the EMI shielding layer and each of the interconnection layers may increase due to the oxidized side surfaces of the interconnection layers. In contrast, the conductive structure 380 of the semiconductor package 300A according to an embodiment may be provided to reduce the contact resistance value between the conductive structure 380 and the EMI shielding layer 394 and to electrically connect the EMI shielding layer 394 to a ground terminal. Thus, it may be unnecessary to form the conductive structure 380 using a material having a relatively high electric conductivity. Therefore, the conductive structure 380 may be realized using an oxidation-resistant material even though the oxidation-resistant material has a low electric conductivity. For example, the conductive structure 380 may be realized using a stainless steel material because the stainless steel material is less susceptible to oxidation as compared to other materials when exposed to the air, even though the stainless steel material has an electric conductivity which is lower than an electric conductivity of the copper material. Accordingly, if the conductive structure 380 is realized using an oxidation-resistant material, a contact resistance value between the conductive structure 380 and the EMI shielding layer 394 may be uniform and relatively low since the oxidation-resistant material is less susceptible to oxidation even though the oxidation-resistant material is exposed to the air before the EMI shielding layer 394 is formed.

Figure 9:
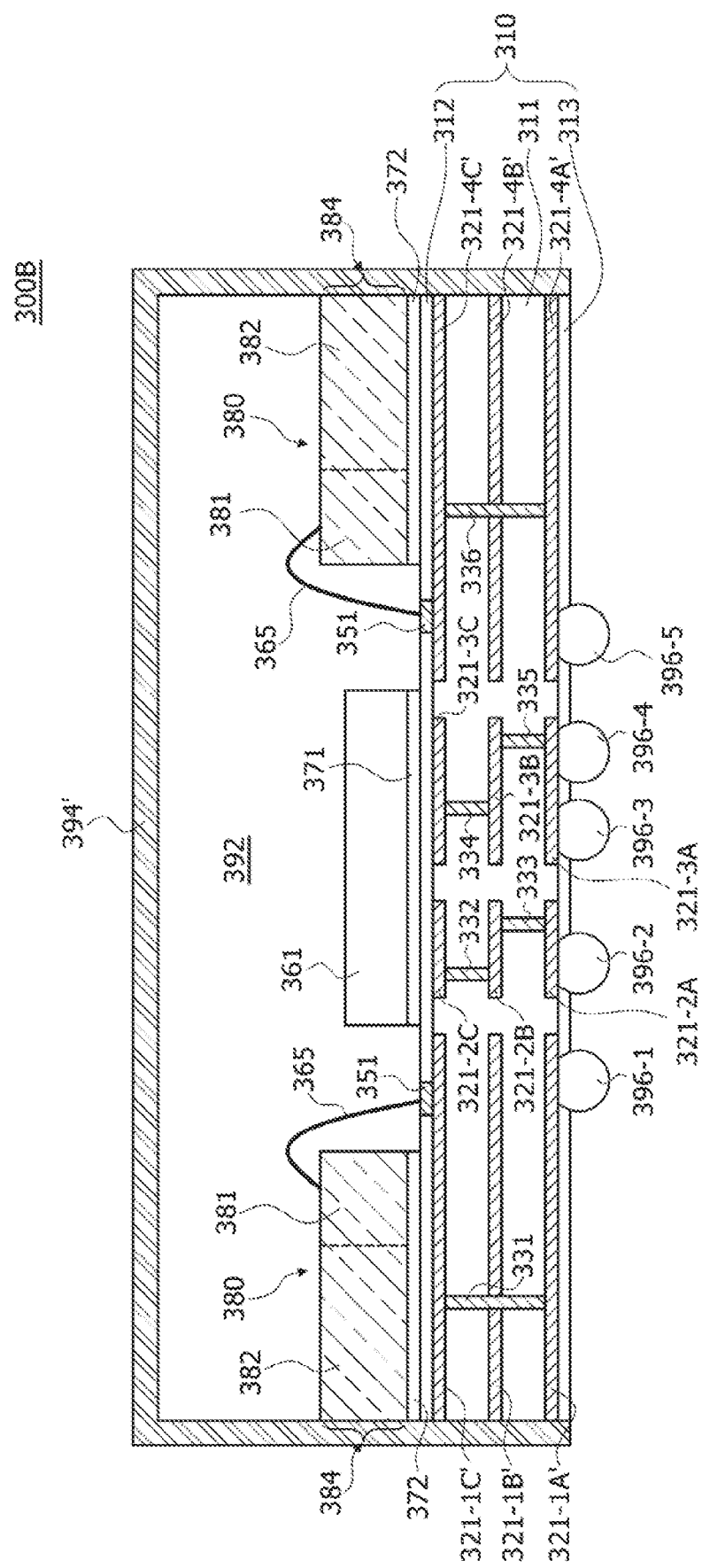
FIG. 9 is a cross-sectional view illustrating another example of the semiconductor package illustrated in FIG. 8.

FIG. 9 is a cross-sectional view illustrating a semiconductor package 300B corresponding to another example of the semiconductor package 300A illustrated in FIG. 8. The semiconductor package 300B may have the same planar structure as illustrated in FIG. 7, and FIG. 9 may also be a cross-sectional view taken along the line III-III' of FIG. 7. In FIG. 9, the same reference numerals as used in FIG. 8 denote the same elements. Thus, detailed descriptions of the same elements as set forth with reference to FIG. 8 will be omitted hereinafter to avoid a repeated description. Referring to FIG. 9, an interconnection structure disposed in the substrate body 311 included in the semiconductor package 300B may be configured to include lower interconnection layers 321-1A', 321-2A, 321-3A, and 321-4A' disposed in a lower portion of the substrate body 311; upper interconnection layers 321-1C', 321-2C, 321-3C, and 321-4C' disposed in an upper portion of the substrate body 311; and intermediate interconnection layers 321-1B', 321-2B, 321-3B, and 321-4B' disposed in a middle portion of the substrate body 311. The lower interconnection layer 321-1A' and the upper interconnection layer 321-1C' may be electrically connected to each other by the first via 331. The lower interconnection layer 321-4A' and the upper interconnection layer 321-4C' may be electrically connected to each other through the sixth via 336.

In an embodiment, the solder ball 396-1 connected to the lower interconnection layer 321-1A' and the solder ball 396-5 connected to the lower interconnection layer 321-4A' among the solder balls 396-1, 396-2, 396-3, 396-4, and 396-5 may be connected to a ground terminal. Thus, the bonding pads 351 disposed on the substrate body 311 may be connected to the solder balls 396-1 and 396-5 having a ground voltage through the upper interconnection layers 321-1C and 321-4C', the first and sixth vias 331 and 336, and the lower interconnection layers 321-1A' and 321-4A'. In some instances, the bonding pads 351 disposed on the substrate body 311 may be connected to the solder balls 396-1 and 396-5 having a ground voltage through the upper interconnection layers 321-1C and 321-4C', the intermediate interconnection layers 321-1B' and 321-4B', the first and sixth vias 331 and 336, and the lower interconnection layers 321-1A' and 321-4A'. In the example illustrated in FIG. 9, outer side surfaces of the lower interconnection layers 321-1A' and 321-4A', outer side surfaces of the intermediate interconnection layers 321-1B' and 321-4B', and outer side surfaces of the upper interconnection layers 321-1C' and 321-4C' may be exposed at side surfaces of the substrate body 311. As such, all of the lower interconnection layers 321-1A' and 321-4A', the intermediate interconnection layers 321-1B' and 321-4B', and the upper interconnection layers 321-1C' and 321-4C', which are exposed at the side surfaces of the substrate body 311, may be defined as grounded interconnection layers electrically connected to the ground terminal. The semiconductor package 300B may also include an EMI shielding layer 394'. The EMI shielding layer 394' may be disposed to cover the top surface and the side surfaces of the molding member 392 as well as the outer side surfaces of the conductive structure 380. Moreover, the EMI shielding layer 394' may extend to be in contact with side surfaces of the substrate body 311, side surfaces of the upper and lower solder resist layers 312 and 313, the exposed outer side surfaces of the lower interconnection layers 321-1A' and 321-4A', the exposed outer side surfaces of the intermediate interconnection layers 321-1B' and 321-4B', and the exposed outer side surfaces of the upper interconnection layers 321-1C' and 321-4C'. Accordingly, since the EMI shielding layer 394' is grounded through the interconnection layers in the substrate body 311 in addition to the conductive structure 380, an EMI shielding effect of the semiconductor package 300B may be improved.

Figure 10:
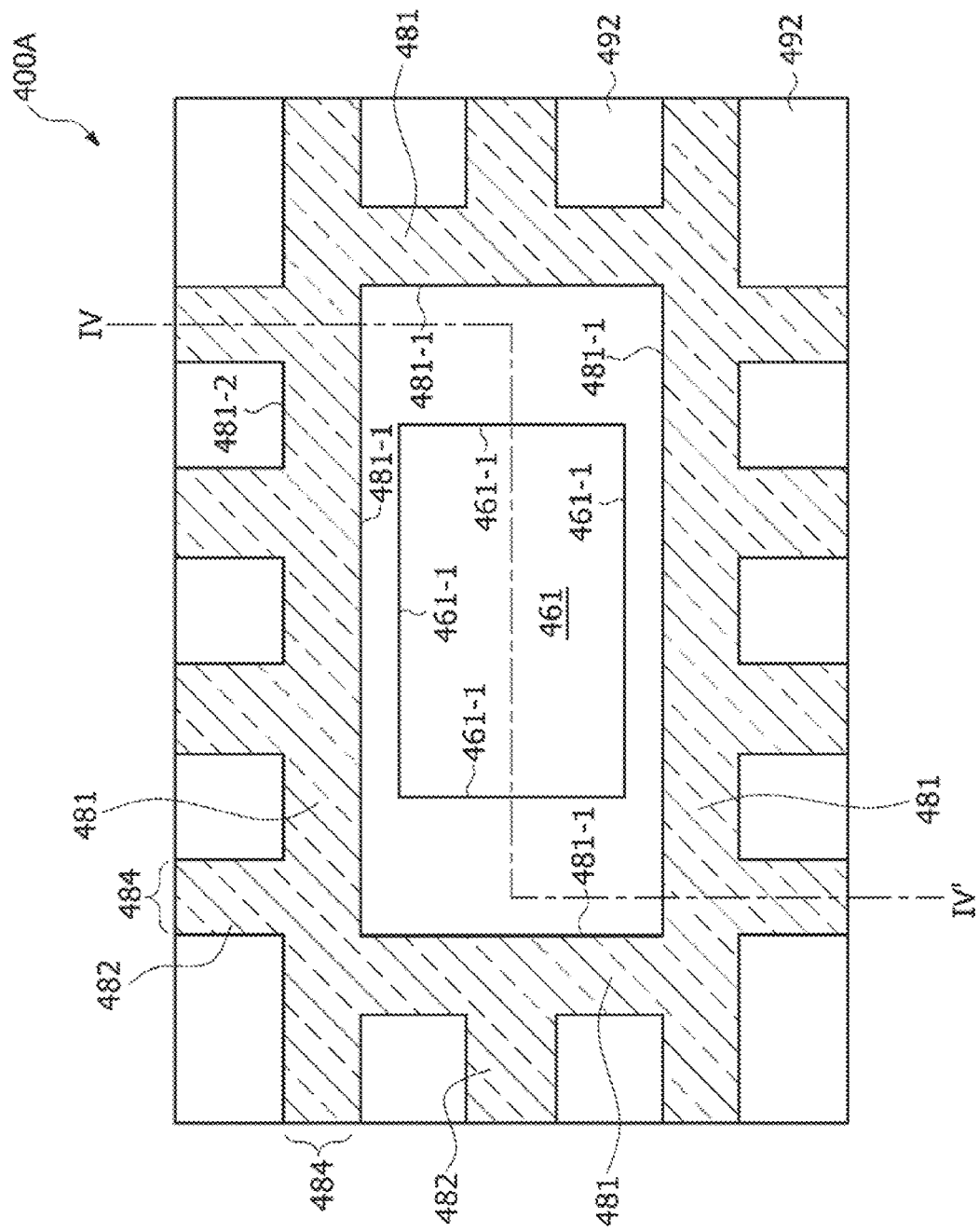
FIG. 10 is a layout diagram illustrating a planar structure of a semiconductor package according to still other embodiments of the present disclosure.
Figure 11:
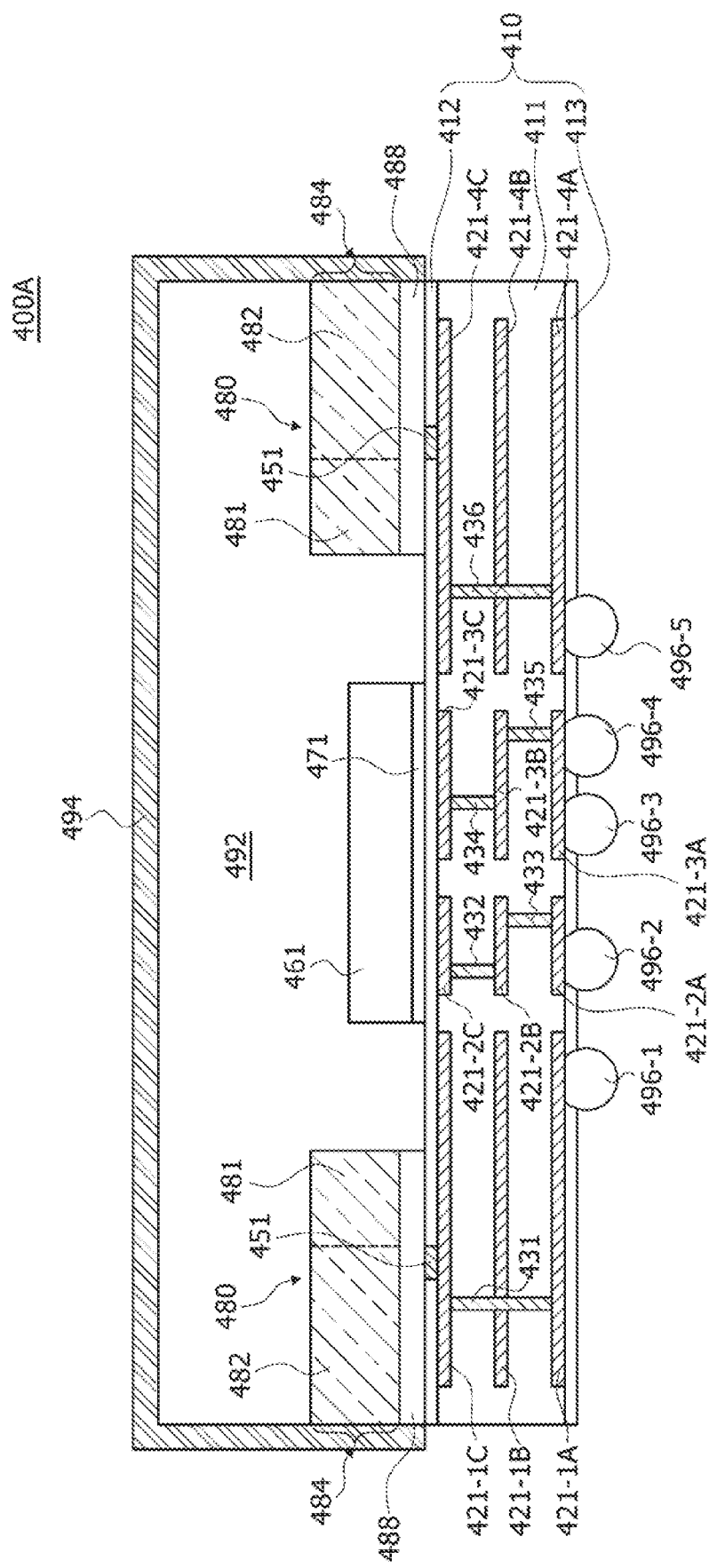
FIG. 11 is a cross-sectional view taken along a line IV-IV' of FIG. 10.

FIG. 10 is a layout diagram illustrating a planar structure of a semiconductor package 400A according to other embodiments of the present disclosure, and FIG. 11 is a cross-sectional view taken along a line IV-IV' of FIG. 10. A molding member 492 and an EMI shielding layer 494 illustrated in FIG. 11 are omitted in FIG. 10. Referring to FIGS. 10 and 11, the semiconductor package 400A may be configured to include a substrate 410, a chip 461, a conductive structure 480, a molding member 492 and an EMI shielding layer 494. The substrate 410 may include a substrate body 411, an upper solder resist layer 412 disposed on a top surface of the substrate body 411, and a lower solder resist layer 413 disposed on a bottom surface of the substrate body 411. A triple-layered interconnection structure may be disposed in the substrate body 411. Although FIG. 11 illustrates an example in which the interconnection structure is comprised of three layers located at different levels, the present disclosure is not limited thereto. For example, in some other embodiments, the layers included in the interconnection structure may be located at one level, two different levels, four different levels, or more different levels. In addition, the interconnection structure in the described embodiment is merely one example of suitable structures. That is, the interconnection structure disposed in the substrate body 411 may be modified into any one of various different forms according to a purpose of the semiconductor package 400A.

The interconnection structure in the substrate body 411 may be configured to include lower interconnection layers 421-1A, 421-2A, 421-3A, and 421-4A disposed in a lower portion of the substrate body 411; upper interconnection layers 421-1C, 421-2C, 421-3C, and 421-4C disposed in an upper portion of the substrate body 411; and intermediate interconnection layers 421-1B, 421-2B, 421-3B, and 421-4B disposed in a middle portion of the substrate body 411. The interconnection layers located at different levels may be electrically connected to each other using various techniques. For example, the interconnection layers located at different levels may be electrically connected to each other through via structures. In an embodiment, the lower interconnection layer 421-1A and the upper interconnection layer 421-1C may be electrically connected to each other by a first via 431. The upper interconnection layers 421-2C and 421-3C may be electrically connected to the intermediate interconnection layers 421-2B and 421-3B through second and fourth vias 432 and 434, respectively. The intermediate interconnection layers 421-2B and 421-3B may be electrically connected to the lower interconnection layers 421-2A and 421-3A through third and fifth vias 433 and 435, respectively. The lower interconnection layer 421-4A and the upper interconnection layer 421-4C may be electrically connected to each other through a sixth via 436. Although not illustrated in the drawings, the intermediate interconnection layer 421-1B may be electrically connected to the lower interconnection layer 421-1A and the upper interconnection layer 421-1C through other vias, and the intermediate interconnection layer 421-4B may also be electrically connected to the lower interconnection layer 421-4A and the upper interconnection layer 421-4C through other vias.

The upper solder resist layer 412 may be disposed on a top surface of the substrate body 411 and top surfaces of the upper interconnection layers 421-1C, 421-2C, 421-3C, and 421-4C. The upper solder resist layer 412 may have openings that expose portions of the upper interconnection layers 421-1C and 421-4C. Contact pads 451 may be disposed on the exposed portions of the upper interconnection layers 421-1C and 421-4C, respectively. The number of the contact pads 451 may be two or more. The contact pads 451 may be disposed not to vertically overlap with the chip 461 but to vertically overlap with the conductive structure 480. The lower solder resist layer 413 may be disposed on a bottom surface of the substrate body 411 and bottom surfaces of the lower interconnection layers 421-1A, 421-2A, 421-3A, and 421-4A. The lower solder resist layer 413 may have openings that expose portions of the lower interconnection layers 421-1A, 421-2A, 421-3A, and 421-4A.

Solder balls 496-1, 496-2, 496-3, 496-4, and 496-5 may be disposed on the exposed portions of the lower interconnection layers 421-1A, 421-2A, 421-3A, and 421-4A. The solder balls 496-1, 496-2, 496-3, 496-4, and 496-5 may be attached to a motherboard of an external electronic device to act as signal transmitters between the semiconductor package 400A and the motherboard. In an embodiment, the solder ball 496-1 connected to the lower interconnection layer 421-1A and the solder ball 496-5 connected to the lower interconnection layer 421-4A among the solder balls 496-1, 496-2, 496-3, 496-4, and 496-5 may be connected to a ground terminal, and the remaining solder balls 496-2, 496-3, and 496-4 may correspond to connection means for transmitting signals and a power supply voltage. In such a case, the contact pads 451 may be connected to the solder balls 496-1 and 496-5 having a ground voltage through the upper interconnection layers 421-1C and 421-4C, the first and sixth vias 431 and 436, and the lower interconnection layers 421-1A and 421-4A. In some instances, the contact pads 451 may be connected to the solder balls 496-1 and 496-5 having a ground voltage through the upper interconnection layers 421-1C and 421-4C, the intermediate interconnection layers 421-1B and 421-4B, the first and sixth vias 431 and 436, and the lower interconnection layers 421-1A and 421-4A. In an embodiment, the lower interconnection layers 421-1A and 421-4A, the intermediate interconnection layers 421-1B and 421-4B, and the upper interconnection layers 421-1C and 421-4C may be disposed in the substrate body 411 such that side surfaces of the lower interconnection layers 421-1A and 421-4A, the intermediate interconnection layers 421-1B and 421-4B, and the upper interconnection layers 421-1C and 421-4C are not exposed at side surfaces of the substrate body 411.

The chip 461 may be attached to a first region (e.g., a chip attachment region) of the upper solder resist layer 412 using an adhesive agent 471. Although not illustrated in the drawings, the chip 461 may be electrically connected to the interconnection layers disposed in the substrate body 411 through wires. Alternatively, the chip 461 may be electrically connected to the interconnection layers disposed in the substrate body 411 using a flip chip bonding technique without using any wire. The conductive structure 480 may be attached to a second region of the upper solder resist layer 412 using a conductive adhesive layer 488. In an embodiment, the conductive adhesive layer 488 may be provided to electrically connect the conductive structure 480 to the interconnection layers in the substrate body 411. That is, the conductive structure 480 may be electrically connected to the interconnection layers in the substrate body 411 through the conductive adhesive layer 488 even without using the wires 365 described with reference to FIGS. 7 to 9.

The conductive structure 480 may be configured to include a conductive structure frame 481 and a plurality of conductive structure fingers 482. The conductive structure frame 481 may have a uniform width and may have a closed loop shape in a plan view to surround all side surfaces 461-1 of the chip 461. The conductive structure frame 481 may be disposed to be spaced apart from the chip 461. That is, inner side surfaces 481-1 of the conductive structure frame 481 may be spaced apart from side surfaces 461-1 of the chip 461. A physical stiffness property of the semiconductor package 400A may be improved because of the presence of the conductive structure frame 481 having a closed loop shape. In addition, the conductive structure frame 481 may act as a supporter for stably maintaining the initial structure of the substrate 410 and the molding member 492 without any deformation while the semiconductor package 400A is fabricated. The plurality of conductive structure fingers 482 may extend from an outer side surface 481-2 of the conductive structure frame 481 toward edges of the substrate 410. That is, the conductive structure frame 481 and the plurality of conductive structure fingers 482 may constitute a single unified body without any heterogeneous junction between the conductive structure frame 481 and each of the plurality of conductive structure fingers 482. The plurality of conductive structure fingers 482 may be disposed to be spaced apart from each other along the side surfaces of the semiconductor package 400A (e.g., along all the sides surfaces of the semiconductor package 400A). Side surfaces 484 of ends of the conductive structure fingers 482 extending toward the edges of the substrate 410 may be vertically aligned with side surfaces of the substrate 410.

Some portions of a bottom surface of the conductive adhesive layer 488 may be in direct contact with the contact pads 451, respectively. In an embodiment, the conductive adhesive layer 488 may include a solder paste material or bumps. Alternatively, the conductive adhesive layer 488 may include a conductive paste material or a conductive film. Accordingly, the conductive structure 480 may be electrically connected to the upper interconnection layers 421-1C and 421-4C through the conductive adhesive layer 488 and the contact pads 451. In an embodiment, the conductive adhesive layer 488 may be disposed to vertically overlap with the conductive structure 480 including the conductive structure frame 481 and the plurality of conductive structure fingers 482.

The molding member 492 formed by a molding process may be disposed on the substrate 410. The molding member 492 may include an epoxy molding compound (EMC) material. The molding member 492 may be disposed to cover all of a top surface and side surfaces of the chip 461. The molding member 492 may cover the conductive structure frame 481 and the conductive structure fingers 482 except the side surfaces 484 of the conductive structure fingers 482. The molding member 492 and the side surface 484 of the conductive structure finger 482 may be alternately disposed along the side surfaces of the semiconductor package 400A.

The EMI shielding layer 494 may be disposed on a top surface and side surfaces of the molding member 492. In an embodiment, the EMI shielding layer 494 may include a single-layered metal material or a multi-layered metal material. The EMI shielding layer 494 may cover all of the top surface and the side surfaces of the molding member 492 and may extend to directly contact the side surfaces 484 of the conductive structure fingers 482 and an outer side surface of the conductive adhesive layer 488. The conductive structure finger 482/the conductive adhesive layer 488 and the molding member 492 may be alternately arrayed along the side surfaces of the semiconductor package 400A and may be in contact with the EMI shielding layer 494. As such, since the conductive structure fingers 482 and the conductive adhesive layer 488 having a relatively strong adhesive strength to a metal material are disposed to be exposed at all of the side surfaces of the molding member 492, a relatively weak adhesive strength between the molding member 492 and the EMI shielding layer 494 may be compensated with the conductive structure finger 482 and the conductive adhesive layer 488 that directly contact the EMI shielding layer 494, According to the semiconductor package 400A described above, the EMI shielding layer 494 may be grounded through the conductive structure fingers 482; the conductive structure frame 481; the conductive adhesive layer 488; the contact pads 451; the interconnection layers 421-1A, 421-1B, 421-1C, 421-4A, 421-4B, and 421-4C disposed in the substrate body 411; the first and sixth vias 431 and 436; and the solder balls 496-1 and 496-5. In an embodiment, the EMI shielding layer 494 may be grounded through the conductive structure fingers 482; the conductive structure frame 481; the conductive adhesive layer 488; the contact pads 451; the interconnection layers 421-1A, 421-1C, 421-4A, and 421-4C disposed in the substrate body 411; the first and sixth vias 431 and 436; and the solder balls 496-1 and 496-5.

As described above, the EMI shielding layer 494 of the semiconductor package 400A may be grounded even without directly contacting the interconnection layers disposed in the substrate body 411. Thus, it may be unnecessary to extend the interconnection layers to the side surfaces of the substrate 410 in order to expose the interconnection layers. In general semiconductor packages, interconnection layers disposed in a substrate body may be used as signal transmission paths between a chip mounted on the substrate body and an external device. Thus, the general semiconductor packages may require the interconnection layers having a high electric conductivity. For example, a copper material having a high electric conductivity of approximately $5.8 \times 10^7$ s/m may be widely used in formation of the interconnection layers. However, the copper material may be easily oxidized if the copper material is exposed to the air. If the interconnection layers formed of the copper material is oxidized, an electric conductivity of the interconnection layers may be lowered. Accordingly, if side surfaces of the interconnection layers employed in the general semiconductor packages are exposed at side surfaces of the substrate body to be in contact with an EMI shielding layer of the general semiconductor packages, the exposed side surfaces of the interconnection layers may be easily oxidized before the EMI shielding layer is formed. In such a case, a contact resistance value between the EMI shielding layer and each of the interconnection layers may increase due to the oxidized side surfaces of the interconnection layers. In contrast, the conductive structure 480 of the semiconductor package 400A according to an embodiment may be provided to reduce the contact resistance value between the conductive structure 480 and the EMI shielding layer 494 and to electrically connect the EMI shielding layer 494 to a ground terminal. Thus, it may be unnecessary to form the conductive structure 480 using a material having a relatively high electric conductivity. Therefore, the conductive structure 480 may be realized using an oxidation-resistant material even though the oxidation-resistant material has a low electric conductivity. For example, the conductive structure 480 may be realized using a stainless steel material because the stainless steel material is less susceptible to oxidation as compared to other materials when exposed to in the air even though the stainless steel material has an electric conductivity which is lower than an electric conductivity of the copper material. Accordingly, if the conductive structure 480 is realized using an oxidation-resistant material, a contact resistance value between the conductive structure 480 and the EMI shielding layer 494 may be uniform and relatively low since the oxidation-resistant material is less susceptible to oxidation even though the oxidation-resistant material is exposed to the air before the EMI shielding layer 494 is formed.

Figure 12:
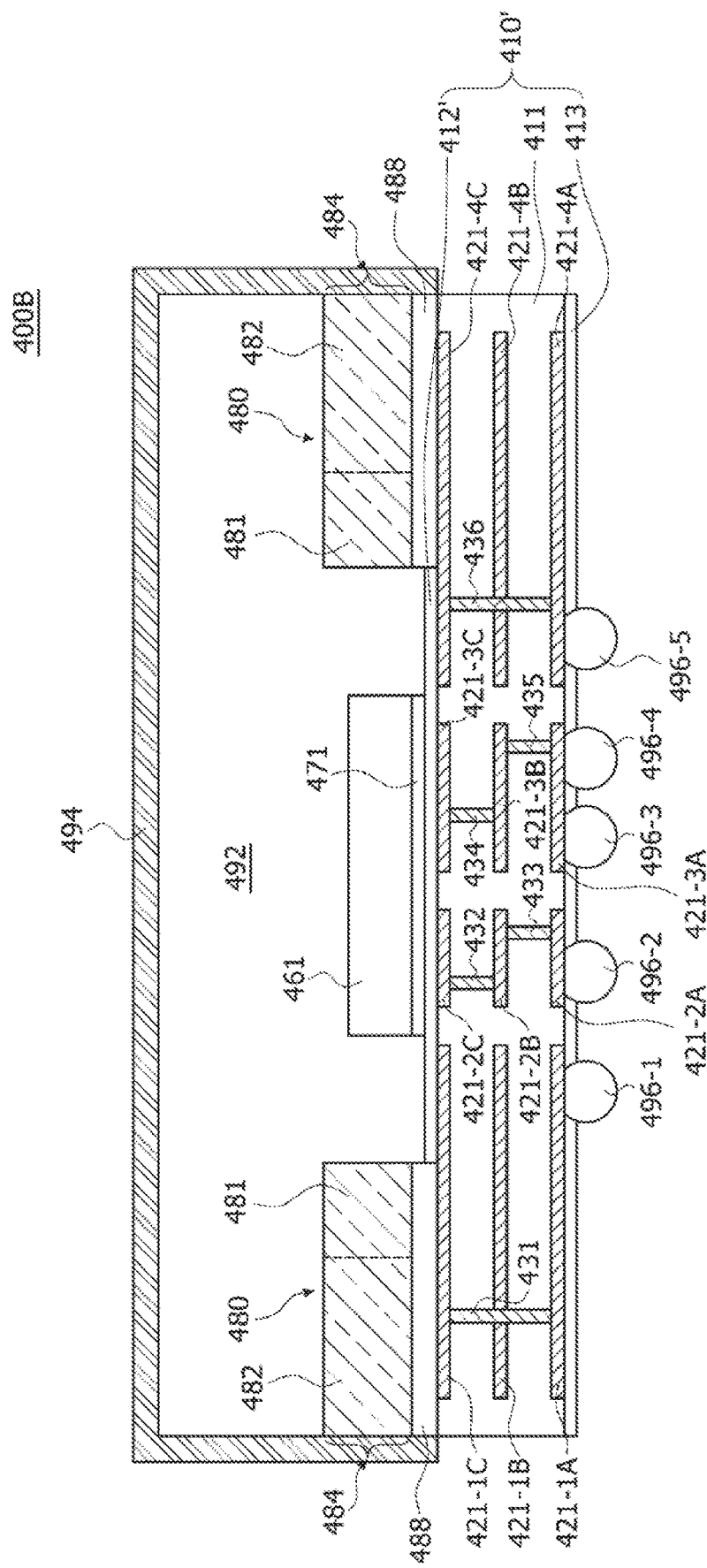
FIG. 12 is a cross-sectional view illustrating other examples of the semiconductor package illustrated in FIG. 11.

FIG. 12 is a cross-sectional view illustrating a semiconductor package 400B corresponding to another example of the semiconductor package 400A shown in FIG. 11. The semiconductor package 400B may have the same planar structure as illustrated in FIG. 10, and FIG. 12 may also be a cross-sectional view taken along the line IV-IV' of FIG. 10. In FIG. 12, the same reference numerals as used in FIG. 11 denote the same elements. Thus, detailed descriptions of the same elements as set forth with reference to FIG. 11 will be omitted hereinafter to avoid a repeated description. Referring to FIG. 12, the semiconductor package 400B may include a substrate 410' which is comprised of the substrate body 411, an upper solder resist layer 412' disposed on a top surface of the substrate body 411, and the lower solder resist layer 413 disposed on a bottom surface of the substrate body 411. The upper solder resist layer 412' may be disposed to have openings that expose portions of the upper interconnection layers 421-1C and 421-4C. Accordingly, each of the upper interconnection layers 421-1C and 421-4C disposed in the substrate body 411 may be partially exposed by the openings of the upper solder resist layer 412'. The conductive adhesive layer 488 may be disposed to directly contact the exposed portions of the upper interconnection layers 421-1C and 421-4C. A contact area between the conductive adhesive layer 488 and each of the upper interconnection layers 421-1C and 421-4C may be equal to a planar area of each of the openings of the upper solder resist layer 412'. Thus, a contact resistance value between the conductive adhesive layer 488 and each of the upper interconnection layers 421-1C and 421-4C may be reduced by increasing a planar area of each of the openings of the upper solder resist layer 412'.

According to the semiconductor package 400B, the EMI shielding layer 494 may be grounded through the conductive structure fingers 482; the conductive structure frame 481; the conductive adhesive layer 488; the interconnection layers 421-1A, 421-1B, 421-1C, 421-4A, 421-4B, and 421-4C disposed in the substrate body 411; the first and sixth vias 431 and 436; and the solder balls 496-1 and 496-5. In an embodiment, the EMI shielding layer 494 may be grounded through the conductive structure fingers 482; the conductive structure frame 481; the conductive adhesive layer 488; the interconnection layers 421-1A, 421-1C, 421-4A, and 421-4C disposed in the substrate body 411; the first and sixth vias 431 and 436; and the solder balls 496-1 and 496-5.

According to various embodiments described above, a conductive structure having a plurality of exposed side surfaces may be disposed on a package substrate, and the conductive structure may be grounded. In addition, an EMI shielding layer may be in contact with the exposed side surfaces of the conductive structure. As a result, a contact resistance value between the conductive structure and the EMI shielding layer may be reduced to improve an EMI shielding effect.

Embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A semiconductor package comprising:
    a chip disposed on a substrate;
    a conductive structure disposed on the substrate to include a conductive structure frame including a side surface facing at least one side surface of the chip and to include conductive structure fingers extending from the conductive structure frame toward an edge of the substrate; and
    an electromagnetic interference (EMI) shielding layer covering the chip and the conductive structure and contacting a side surface of an end of one or more of the conductive structure fingers,
    wherein the substrate includes:
        a substrate body;
        an upper solder resist layer disposed between the substrate body and the chip; and
        a grounded interconnection layer, the grounded interconnection layer being exposed by an opening of the upper solder resist layer and being connected to the conductive structure, and
    wherein the semiconductor package further comprising:
    a bonding pad disposed in the opening of the upper solder resist layer to contact the grounded interconnection layer; and
    a wire connecting the conductive structure to the bonding pad.

2. The semiconductor package of claim 1, wherein the substrate further includes
    a lower solder resist layer disposed on a surface of the substrate body opposite to the chip.

3. The semiconductor package of claim 2,
    wherein the grounded interconnection layer is disposed in the substrate body such that the grounded interconnection layer is not exposed at side surfaces of the substrate body; and
    wherein the EMI shielding layer is disposed to expose the side surfaces of the substrate body.

4. The semiconductor package of claim 3, wherein the grounded interconnection layer is exposed by an opening of the upper solder resist layer, the semiconductor package further comprising:
    a contact pad disposed in the opening of the upper solder resist layer to contact the grounded interconnection layer; and
    a conductive adhesive layer disposed between the conductive structure and the contact pad.

5. The semiconductor package of claim 3, wherein the grounded interconnection layer is exposed by an opening of the upper solder resist layer, the semiconductor package further comprising:
    a conductive adhesive layer disposed in the opening of the upper solder resist layer to contact the grounded interconnection layer.

6. The semiconductor package of claim 1,
    wherein the conductive structure frame includes:
    a first conductive structure frame spaced apart from a side surface of the chip and extending in a first direction; and
    a second conductive structure frame spaced apart from another side surface of the chip and extending in the first direction, and
    wherein the conductive structure fingers include:
    a plurality of first conductive structure fingers extending from an outer side surface of the first conductive structure frame opposite to the chip; and
    a plurality of second conductive structure fingers extending from an outer side surface of the second conductive structure frame opposite to the chip.

7. The semiconductor package of claim 6, wherein side surfaces of both ends of the first conductive structure frame extending in the first direction and side surfaces of both ends of the second conductive structure frame extending in the first direction are in contact with the EMI shielding layer.

8. The semiconductor package of claim 7, further comprising:
    a molding member disposed on the substrate to cover the chip and the conductive structure and to expose the one or more side surfaces of the ends of the conductive structure fingers,
    wherein the EMI shielding layer covers the molding member, and
    wherein the side surfaces of the both ends of the first conductive structure frame extending in the first direction and the side surfaces of the both ends of the second conductive structure frame extending in the first direction are exposed at side surfaces of the molding member and are in contact with the EMI shielding layer.

9. The semiconductor package of claim 6,
    wherein the plurality of first conductive structure fingers are disposed to be spaced apart from each other in the first direction; and
    wherein the plurality of second conductive structure fingers are disposed to be spaced apart from each other in the first direction.

10. The semiconductor package of claim 6, further comprising:
    a molding member disposed on the substrate to cover the chip and the conductive structure and to expose the one or more side surfaces of the ends of the conductive structure fingers,
    wherein the EMI shielding layer covers the molding member, wherein the first conductive structure fingers and the molding member are alternately arrayed in the first direction and are in contact with the EMI shielding layer; and wherein the second conductive structure fingers and the molding member are alternately arrayed in the first direction and are in contact with the EMI shielding layer.

11. The semiconductor package of claim 1, wherein the conductive structure frame is spaced apart from all of side surfaces of the chip and is configured to have a closed loop shape to surround all of the side surfaces of the chip.

12. The semiconductor package of claim 11, further comprising:

a molding member disposed on the substrate to cover the chip and the conductive structure and to expose the one or more side surfaces of the ends of the conductive structure fingers, wherein the EMI shielding layer covers the molding member, and wherein the conductive structure frame is embedded in the molding member such that the conductive structure frame is not exposed at any surface of the molding member.

13. The semiconductor package of claim 11, wherein the conductive structure fingers are disposed to be spaced apart from each other along all side surfaces of the semiconductor package.

14. The semiconductor package of claim 13, further comprising:

a molding member disposed on the substrate to cover the chip and the conductive structure and to expose the one or more side surfaces of the ends of the conductive structure fingers, wherein the EMI shielding layer covers the molding member, and wherein the exposed side surfaces of the conductive structure fingers and the molding member are alternately arrayed along all the side surfaces of the semiconductor package and are in contact with the EMI shielding layer.

15. The semiconductor package of claim 1, further comprising interconnection layers disposed in the substrate, wherein each of the interconnection layers includes a copper material, and wherein the conductive structure includes a stainless steel material.

* * * * *